United States Patent
Koh

(10) Patent No.: US 8,219,378 B1
(45) Date of Patent: Jul. 10, 2012

(54) AUTOMATIC NUMERICAL SIMULATION OF PROCESSOR ENVIRONMENT

(75) Inventor: David Koh, Boston, MA (US)

(73) Assignee: The MathWorks, Inc., Natick, MA (US)

( * ) Notice: Subject to any disclaimer, the term of this patent is extended or adjusted under 35 U.S.C. 154(b) by 1320 days.

(21) Appl. No.: 11/864,475

(22) Filed: Sep. 28, 2007

(51) Int. Cl.
*G06F 9/44* (2006.01)
(52) U.S. Cl. .......................... 703/21; 703/20
(58) Field of Classification Search ............ 703/13, 703/14, 20, 21, 27
See application file for complete search history.

(56) References Cited

U.S. PATENT DOCUMENTS

| | | | |
|---|---|---|---|
| 5,918,035 A * | 6/1999 | Van Praet et al. | 703/22 |
| 7,110,935 B1 * | 9/2006 | Hwang et al. | 703/20 |
| 7,185,315 B2 * | 2/2007 | Sharp et al. | 717/109 |
| 7,684,968 B1 * | 3/2010 | Szedo et al. | 703/14 |
| 2008/0319730 A1 * | 12/2008 | Clark et al. | 703/19 |

* cited by examiner

*Primary Examiner* — Kamini S Shah
*Assistant Examiner* — Herng-der Day
(74) *Attorney, Agent, or Firm* — Harrity & Harrity, LLP

(57) ABSTRACT

A system receives a model, internals associated with a target processor, and code information associated with the target processor, and obtains a bit-true model simulation for the target processor based on the model, the target processor internals, and the target processor code information.

23 Claims, 16 Drawing Sheets

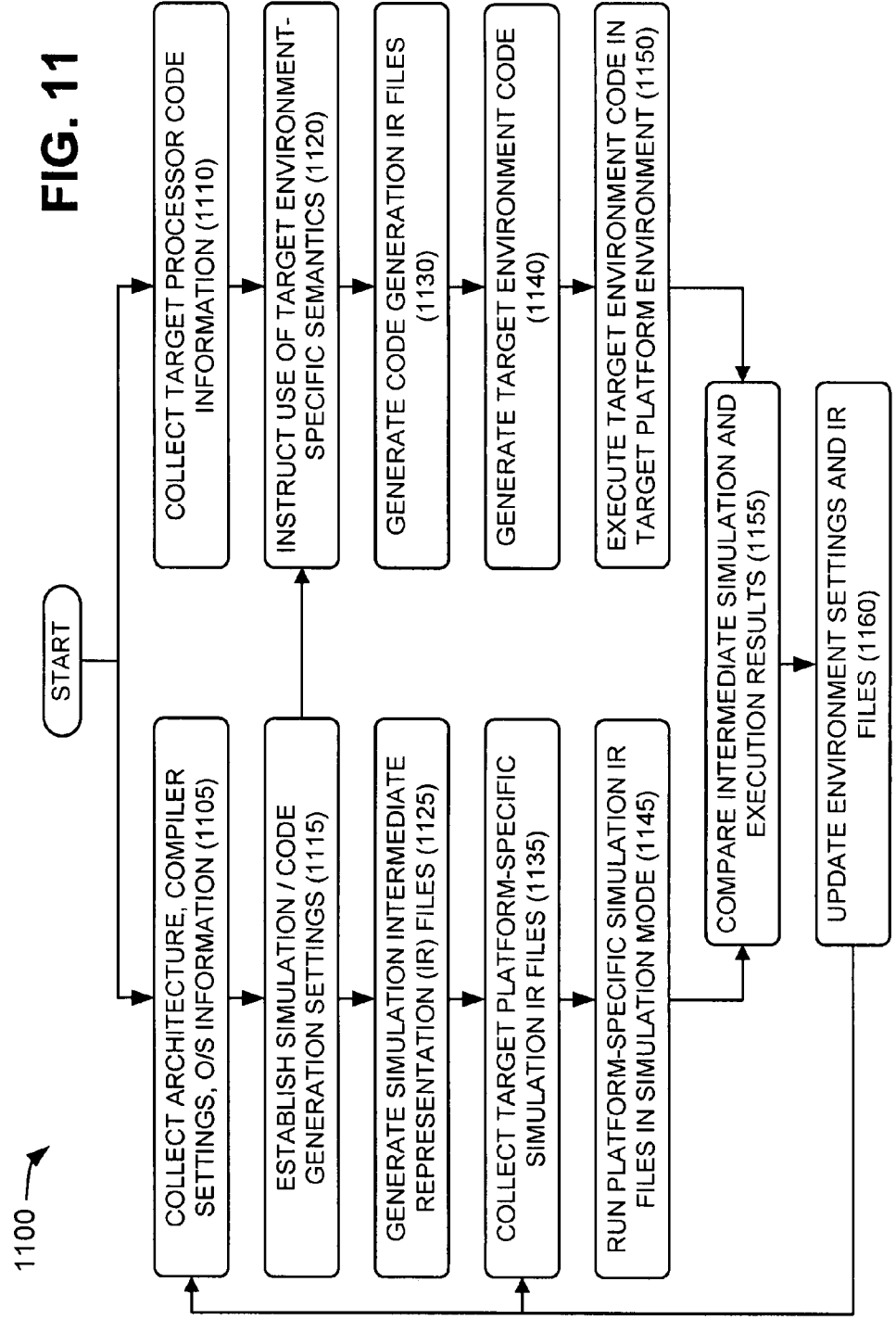

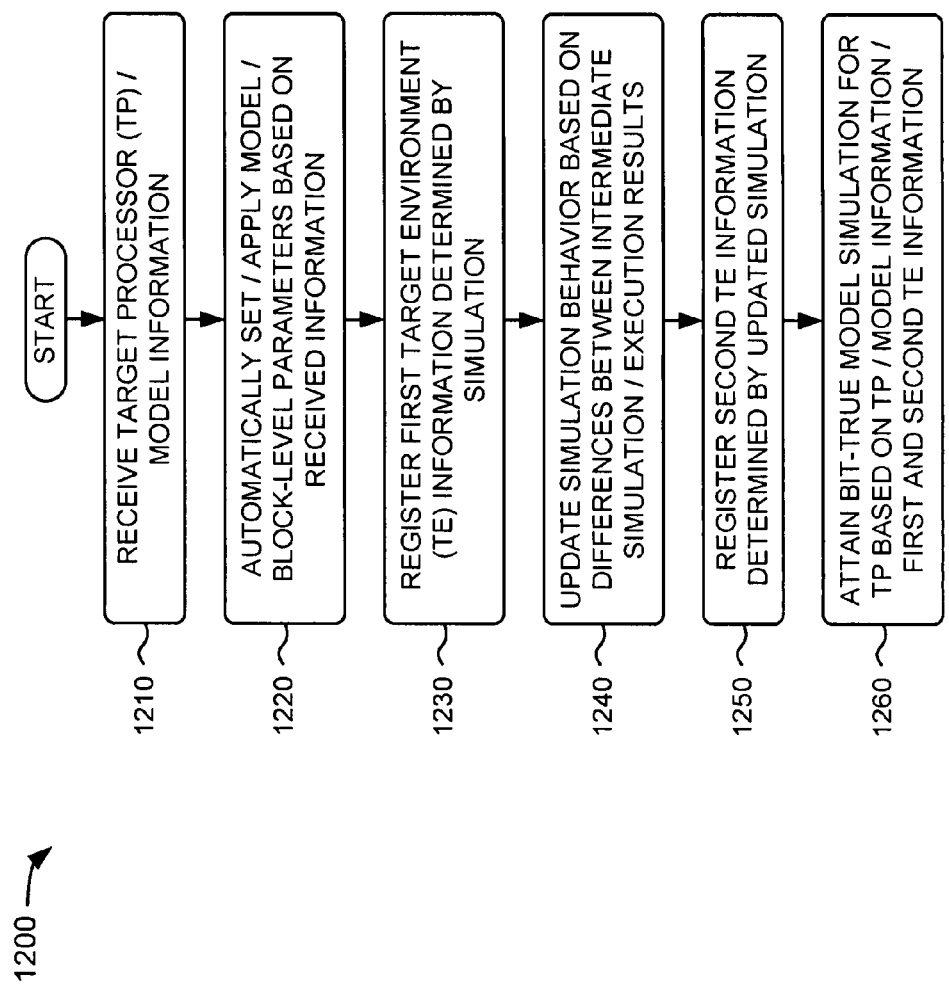

AUTOMATIC NUMERICAL SIMULATION OF PROCESSOR ENVIRONMENT

BACKGROUND

While many simulation-based design environments with associated automatic code generation technology support simulation and code generation of floating-point and fixed point algorithms, it is often difficult or impossible to achieve bit-true results between a design model and generated code implementations. A bit-true simulation is one where finite precision fixed-point and/or floating-point operations are modeled precisely, eliminating the need for an additional logic simulation of the final hardware implementation (i.e., code generation) to determine actual system performance and to generate test vectors. Thus, creation of a bit-true simulation may save time and/or money.

Many fixed point-enabled blocks of design environments (e.g., a signal processing blockset's fast Fourier transform (FFT)) allow a user to specify internal scaling and data sizes to match a target computer processor's internal hardware registers, accumulators, and default rounding modes to achieve numeric equivalence in simulation. However, such user specified options may need to be manually set for each block (e.g., which may be time consuming), and may not enable a user to specify all attributes such that identical results may be achieved. Numerical differences may occur because of inexact characterization (e.g., on the part of the simulation) of the target processor's architecture, compiler, compiler settings, operating system, and/or combinations of the aforementioned. Furthermore, not all blocks may expose internal scaling or bit-widths to this level of fidelity, rendering it impossible for some models to achieve bit-true exactness against the execution results of a target processor.

BRIEF DESCRIPTION OF THE DRAWINGS

The accompanying drawings, which are incorporated in and constitute a part of this specification, illustrate one or more implementations and, together with the description, explain these implementations. In the drawings:

FIGS. 11-13D depict flow charts of exemplary processes according to implementations described herein.

DETAILED DESCRIPTION

Figure 1:
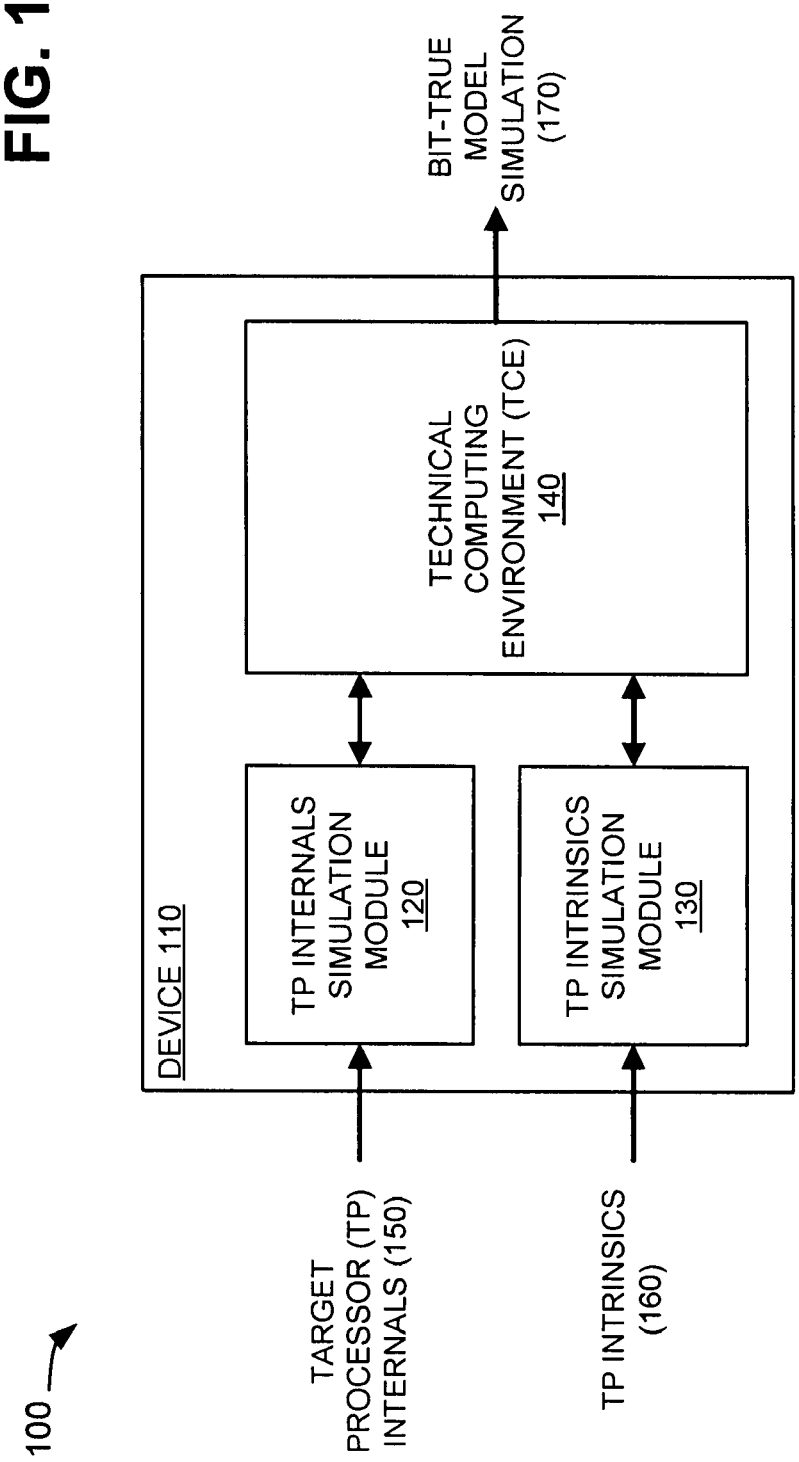
FIG. 1 is an exemplary diagram illustrating a system described herein.

The following detailed description refers to the accompanying drawings. The same reference numbers in different drawings may identify the same or similar elements. Also, the following detailed description does not limit the invention.

Overview

Implementations described herein may provide a mechanism to register and/or specify attributes of a target processor environment that affect numerics, and may constrain simulation behavior of a model (e.g., at each block instance granularity) such that bit-trueness may be guaranteed for each block output of the model, leading to bit-trueness of an entire model. For example, in one implementation, target processor internal attributes (hereinafter referred to as "internals"), such as architecture information, compiler information, compiler settings, and/or operating system information, may be collected by a TCE. Simulation and/or code generation settings may be established, and/or simulation intermediate representation (IR) files may be generated. Target platform-specific simulation IR files (e.g., target processor intrinsics) may be collected by the TCE, and may be executed in a simulation mode to generate intermediate simulation results. A target environment code may be executed in the target platform environment to generate intermediate execution results. The intermediate simulation results and the intermediate execution results may be compared. Environment settings and/or IR files may be updated, and the process may continue until the model simulation matches a code generated implementation executed on the target processor (i.e., until a bit-true model simulation is achieved). The settings may be saved for subsequent bit-true correspondence between simulation and generated code in subsequent models.

As used herein, the term "target processor internals" is intended to be broadly interpreted to include any internal logic (e.g., hardware and/or software) attributes of a target processor. For example, target processor internals may include the target processor's architecture (e.g., hardware registers, accumulators, default rounding modes to achieve numeric equivalence in simulation, rounding behavior of arithmetic and/or shift operations, etc.), the target processor's compiler behavior and/or compiler settings (e.g., rounding mode, compiler-specific intrinsics, compiler-specific run-time libraries, conversions of float to fixed data types, optimization level, etc.), the target processor's operating system behavior (e.g., operating system-specific run-time libraries, etc.), etc.

As used herein, the term "target processor intrinsics" is intended to be broadly interpreted to include any compiler-specific built-in function, assembly language, or machine code that improves execution performance with respect to the target processor. For example, target processor intrinsics may include functions that enable use of function calls and variables in place of assembly mnemonics and/or registers associated with the target processor (e.g., a "MMX" single instruction, multiple data (SIMD) instruction set, Streaming SIMD Extensions (SSE), Streaming SIMD Extensions 2 (SSE2), native processor intrinsics, general purpose intrinsics, etc.), optimal target processor-specific instructions that may exhibit numerical side effects that differ from simulation (e.g., instructions to perform saturated arithmetic and/or shift operations), optimal target processor-specific C-callable intrinsics, etc.

Exemplary System

FIG. 1 is an exemplary diagram illustrating a system 100 described herein. As illustrated in FIG. 1, system 100 may include a device 110 that includes a target processor (TP) internals simulation module 120, a TP intrinsics module 130, and/or a TCE 140. Device 110 may include an entity, such as a personal computer, a laptop, or another type of computation or communication device, a thread or process running on one of these devices, and/or an object executable by one of these devices.

TP internals simulation module 120 may receive TP internals 150, and may perform a numeric simulation of TP internals 150. TP internals simulation module 120 may use the numerically simulated TP internals 150 to automatically set simulation parameters for a model simulation (e.g., performed by TCE 140). TP internals simulation module 120 may provide and/or register the simulation parameters of TP internals 150 in TCE 140.

TP intrinsics simulation module 130 may receive TP intrinsics 160, and may perform a numeric simulation of TP intrinsics 160. TP intrinsics simulation module 130 may provide and/or register the simulation behavior of TP intrinsics 160 in TCE 140.

TP internals simulation module 120 may operate in conjunction with TCE 140 to iteratively test and/or add to a list of TP internals 150 until the model simulation (e.g., performed by TCE 140) matches a code generated implementation executed on the target processor (i.e., until a bit-true model simulation 170 is achieved). TP intrinsics simulation module 130 may operate in conjunction with TCE 140 to iteratively test and/or add simulation syntax for TP intrinsics 160 until the model simulation (e.g., performed by TCE 140) matches a code generated implementation executed on the target processor (i.e., until bit-true model simulation 170 is achieved).

A "technical computing environment" or "TCE," as the terms are used herein, is to be broadly interpreted to include any hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc. In one implementation, a technical computing environment may include a dynamically-typed programming language (e.g., the MATLAB® M language) that can be used to express problems and/or solutions in mathematical notations. For example, a TCE may use an array as a basic element, where the array may not require dimensioning. In addition, a TCE may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state based analysis and/or design, etc.

A TCE may further provide mathematical functions and/or graphical tools (e.g., for creating plots, surfaces, images, volumetric representations, etc.). In one implementation, a TCE may provide these functions and/or tools using toolboxes (e.g., toolboxes for signal processing, image processing, data plotting, parallel processing, etc.). In another implementation, a TCE may provide these functions as block sets. In still another implementation, a TCE may provide these functions in another way, such as via a library, etc.

A TCE may be implemented as a text-based environment (e.g., MATLAB®; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dynasim; etc.), a graphically-based environment (e.g., Simulink®, Stateflow®, SimEvents™, Real-Time Workshop®, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from Telelogic; Ptolemy from the University of California at Berkeley; aspects of a Unified Modeling Language (UML) or SysML environment; etc.), or another type of environment, such as a hybrid environment that includes one or more of the above-referenced text-based environments and one or more of the above-referenced graphically-based environments.

In an exemplary implementation, device 110 may provide a web service that permits access to one or more components of device 110. A "web service," as the term is used herein, is to be broadly interpreted to include any software application that allows machine-to-machine communications over a network (e.g., a local area network (LAN), a metropolitan area network (MAN), a wide area network (WAN), such as the Internet, etc.). For example, a web service may communicate with a client (e.g., another device) using an application program interface (API) that the client may access over the network. The web service may exchange Hypertext Markup Language (HTML), Extensible Markup Language (XML), or other types of messages with the client using industry compatible standards (e.g., simple object access protocol (SOAP)) and/or proprietary standards. A web service may further include network services that can be described using industry standard specifications, such as web service definition language (WSDL) and/or proprietary specifications.

In one example, a web service may allow a destination (e.g., a computer operated by a customer) to create a bit-true model of a target processor using hardware and/or software that may be operated by a service provider. For example, the customer may be permitted access to device 110 to create a bit-true model of a target processor if the customer subscribes to one of the offered web services. The service provider may maintain a database that includes parameters, such as parameters that enable creation of the bit-true model. The service provider may perform a look-up operation in the database if a request for bit-true model generation is received from the customer. The service provider may connect the customer to bit-true model generation resources that are available based on parameters in the database.

In another example, the customer may receive the web service on a subscription basis. A subscription may include substantially any type of arrangement, such as monthly subscription, a per-use fee, a fee based on an amount of information exchanged between the service provider and the customer, a fee based on a number of processor cycles used by the customer, a fee based on a number of bit-true model generation resources used by the customer, etc.

Although FIG. 1 shows exemplary components of system 100, in other implementations, system 100 may contain fewer, different, or additional components than depicted in FIG. 1. In still other implementations, one or more components of system 100 may perform one or more of the tasks performed by one or more other components of system 100.

Exemplary Device Architecture

Figure 2:
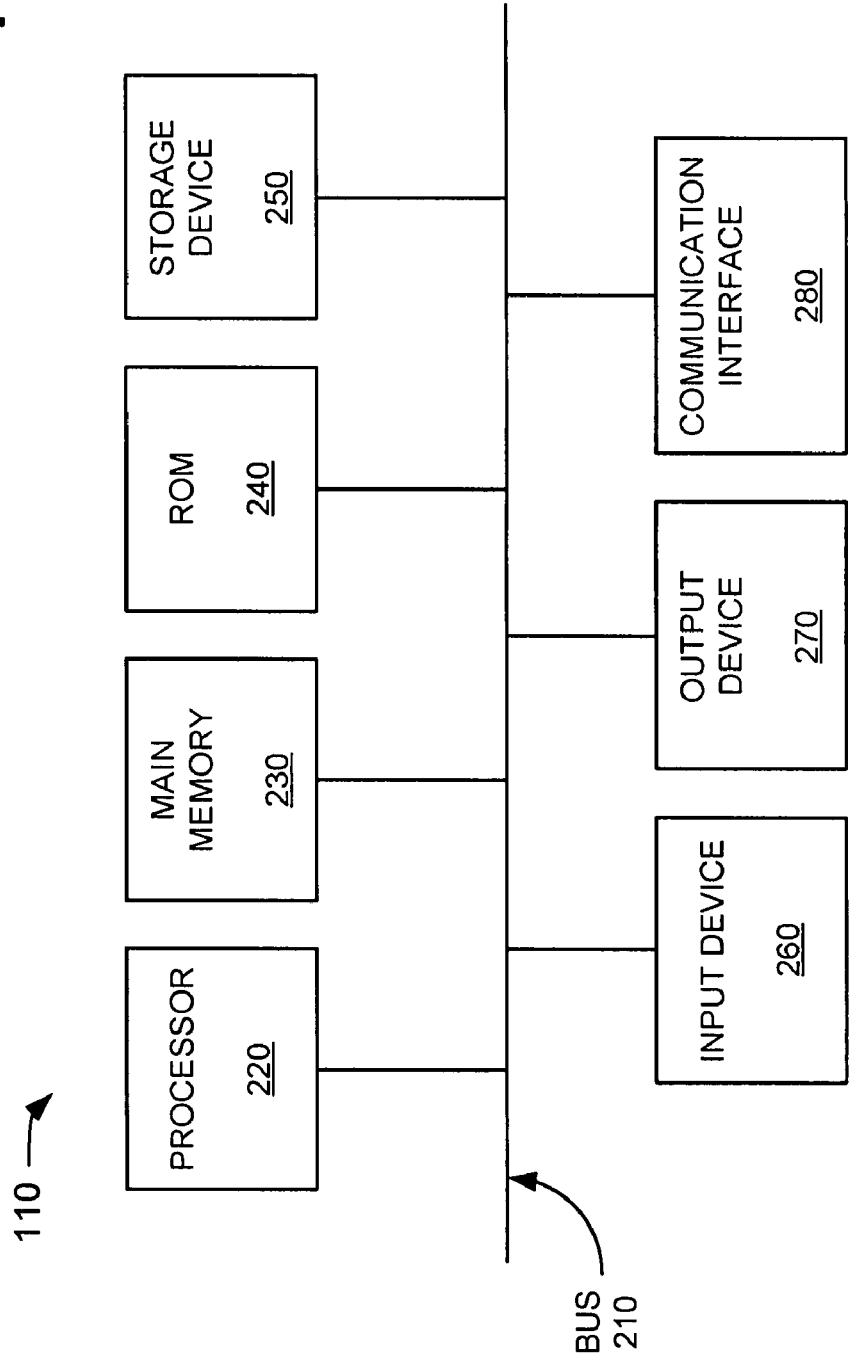
FIG. 2 is an exemplary diagram of a device of the system depicted in FIG. 1.

FIG. 2 is an exemplary diagram of device 110. As illustrated, device 110 may include a bus 210, a processor 220, a main memory 230, a read only memory (ROM) 240, a storage device 250, an input device 260, an output device 270, and a communication interface 280. Bus 210 may include a path that permits communication among the elements of device 110.

Processor 220 may include a processor, microprocessor, or processing logic that may interpret and execute instructions. For example, processor 220 may include a general processing device (e.g., a central processing unit) or another type of device, such as a reduced instruction set processor, a field programmable gate array (FPGA), an application specific integrated circuit (ASIC), etc. In other implementations, processor 220 may include single core devices and/or multi-core devices.

Main memory 230 may include a random access memory (RAM) or another type of dynamic storage device that may store information and instructions for execution by processor 220. ROM 240 may include a ROM device or another type of static storage device that may store static information and instructions for use by processor 220. Storage device 250 may include a magnetic and/or optical recording medium and its corresponding drive.

Input device 260 may include a mechanism that permits an operator to input information to device 110, such as a keyboard, a mouse, a pen, voice recognition and/or biometric mechanisms, etc. Output device 270 may include a mechanism that outputs information to the operator, including a display, a printer, a speaker, etc. Communication interface 280 may include any transceiver-like mechanism that enables device 110 to communicate with other devices and/or systems. For example, communication interface 280 may include mechanisms for communicating with another device 110.

As described herein, device 110, consistent with exemplary implementations, may perform certain processing-related operations. Device 110 may perform these operations in response to processor 220 executing software instructions contained in a computer-readable medium, such as main memory 230. A computer-readable medium may be defined as a physical or logical memory device and/or carrier wave.

The software instructions may be read into main memory 230 from another computer-readable medium, such as storage device 250, or from another device via communication interface 280. The software instructions contained in main memory 230 may cause processor 220 to perform processes that will be described later. Alternatively, hardwired circuitry may be used in place of or in combination with software instructions to implement processes described herein. Thus, implementations described herein are not limited to any specific combination of hardware circuitry and software.

Although FIG. 2 shows exemplary components of device 110, in other implementations, device 110 may contain fewer, different, or additional components than depicted in FIG. 2. In still other implementations, one or more components of device 110 may perform some or all of the tasks described as being performed by one or more other components of device 110.

Exemplary Technical Computing Environment

Figure 3:
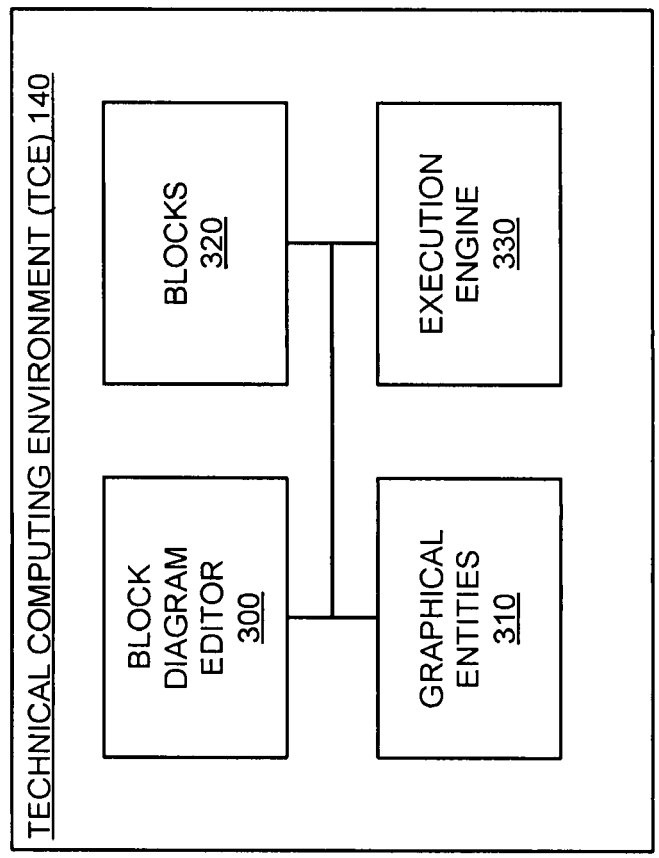
FIG. 3 is an exemplary diagram of a technical computing environment that may be used by the device of FIGS. 1 and 2.

FIG. 3 is an exemplary diagram of TCE 140 that may be used by device 110 to automatically simulate a target processor environment to attain numerical equivalence between a simulation design and an automatically generated code. In one implementation, TCE 140 may be provided within a computer-readable medium of device 110 (e.g., main memory 230, ROM 240, and/or storage device 250). In other implementations, TCE 140 may be provided in another device that is accessible by device 110 (e.g., via communication interface 280).

As shown in FIG. 3, TCE 140 may include a variety of components, such as a block diagram editor 300, graphical entities 310, blocks 320, and/or an execution engine 330. Block diagram editor 300 may graphically specify models of dynamic systems. In one implementation, block diagram editor 300 may permit a user to perform actions, such as construct, edit, display, rotate, move, annotate, save, and/or print a graphical model (e.g., a block diagram that visually and/or pictorially represents a dynamic system). In another implementation, block diagram editor 300 may permit a user to create and/or store data relating to graphical entities 310.

A textual interface with a set of commands may be provided to permit interaction with block diagram editor 300. A user may write scripts that perform automatic editing operations on a model using the textual interface. For example, the textual interface may provide a set of windows that may act as a canvas for the model, and may permit user interaction with the model. A model may include one or more windows depending on whether the model is partitioned into multiple hierarchical levels.

Graphical entities 310 may include entities (e.g., signal lines, buses, etc.) that represent how data may be communicated between functional and/or non-functional units and blocks 320 of a model. Blocks 320 may include elements of a block diagram model. For example, blocks 320 may include fundamental mathematical elements.

Execution engine 330 may process a graphical model to produce simulation results, may convert the graphical model from a first format into a second format (e.g., from a source representation into an executable representation (e.g., code)), and/or may perform other analyses and/or related tasks. In one implementation, for a block diagram graphical model, execution engine 330 may translate the block diagram into executable entities (e.g., units of execution) following the layout of the block diagram. The executable entities may be compiled and/or executed on a device (e.g., device 110) to implement the functionality specified by the model.

Although FIG. 3 shows exemplary components of TCE 140, in other implementations, TCE 140 may contain fewer, different, or additional components than depicted in FIG. 3. In still other implementations, one or more components of TCE 140 may perform some or all of the tasks described as being performed by one or more other components of TCE 140.

Figure 4:
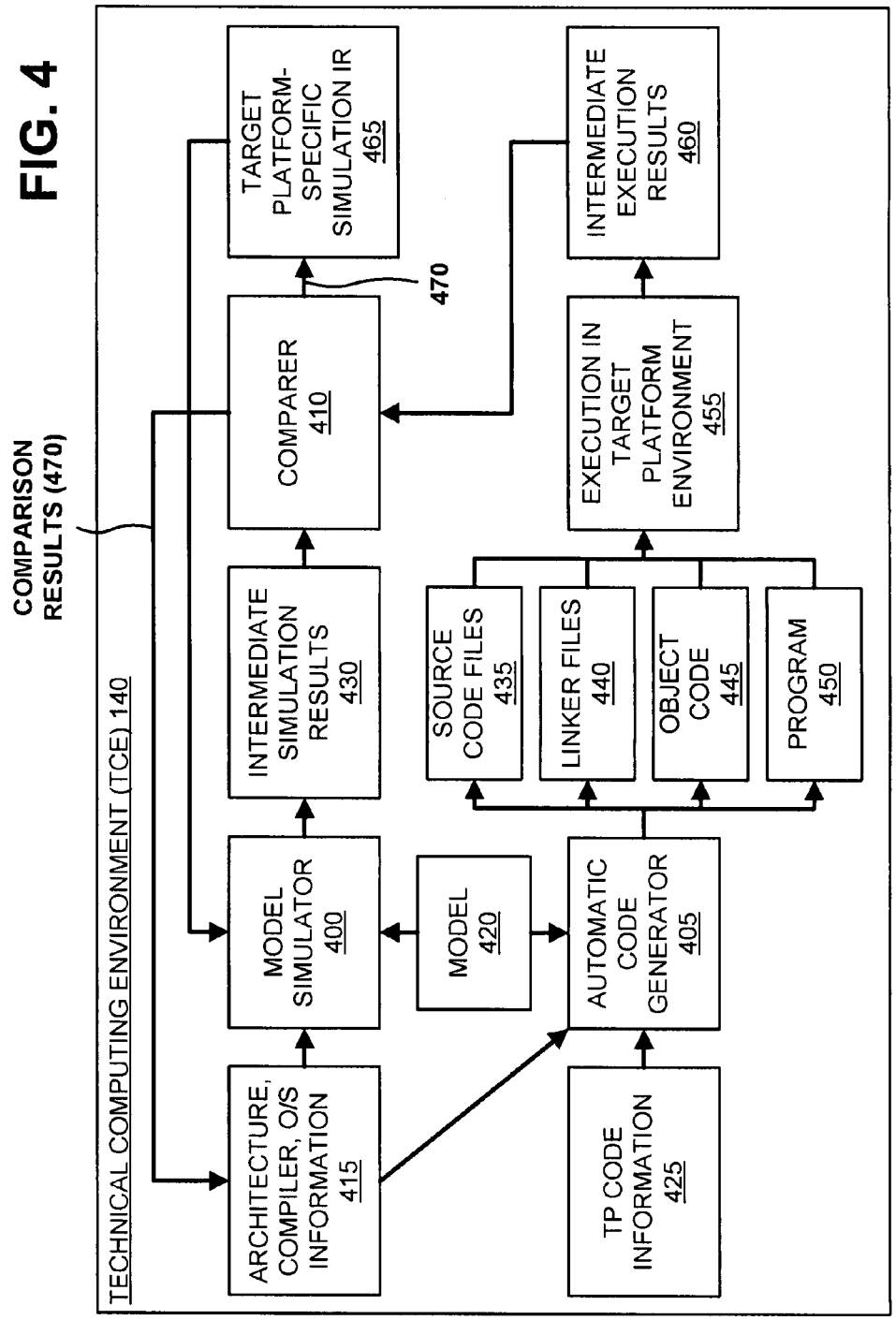
FIG. 4 is another exemplary diagram of the technical computing environment depicted in FIG. 3.

FIG. 4 is another exemplary diagram of TCE 140. As illustrated, TCE 140 may include a model simulator 400, an automatic code generator 405, a comparer 410, architecture, compiler, operating system (O/S) information 415, a model 420, target processor (TP) code information 425, intermediate simulation results 430, source code files 435, linker files 440, object code 445, a program 450, execution in target platform environment 455, intermediate execution results 460, and/or target platform-specific simulation IR files 465. Although not shown in FIG. 4, TCE 140 may also include block diagram editor 300, graphical entities 310, blocks 320, and/or execution engine 330, as described above in connection with FIG. 3.

Model simulator 400 may receive architecture, compiler, O/S information 415, model 420, and/or target platform-specific simulation IR files 465, and may generate intermediate simulation results 430 based on the received information. Model simulator 400 may include a design environment that may permit a model to execute in simulation mode. The design environment of model simulator 400 may use one or more of architecture, compiler, O/S information 415, model 420, and/or target platform-specific simulation IR 465 to generate intermediate simulation results 430. In one implementation, model simulator 400 may collect target processor internals (e.g., architecture, compiler, O/S information 415), may establish simulation and/or code generation settings, and/or may generate simulation intermediate representation (IR) files (e.g., intermediate simulation results 430). Model simulator 400 may collect target platform-specific simulation IR files 465, may execute files 465 in a simulation mode to generate intermediate simulation results 430, may compare intermediate results (e.g., intermediate simulation results 430), and/or may update environment settings and/or IR files. Further details of model simulator 400 are provided below in connection with FIG. 5.

Automatic code generator 405 may receive architecture, compiler, O/S information 415, model 420, and/or TP code information 425, and may generate source code files 435, linker files 440, object code 445, and/or program 450 based on the received information. In one implementation, automatic code generator 405 may receive model 420 and/or various target environment inputs and other user inputs (e.g., architecture, compiler, O/S information 415, TP code information 425, etc.), and may generate target environment-specific code that can execute efficiently in a target environment. Automatic code generator may execute source code files 435, linker files 440, object code 445, and/or program 450 in target platform environment 455 to generate intermediate execution results 460. In an exemplary embodiment, automatic code generator 405 may include the Real-Time Workshop® available from The MathWorks, Inc. Further details of automatic code generator 405 are provided below and in connection with FIG. 6.

Comparer 410 may receive intermediate simulation results 430 and/or intermediate execution results 460, and may generate comparison results 470 based on the received information. For example, comparer 410 may compare intermediate simulation results 430 and intermediate execution results 460, may flag any differences between results 430 and 460, and may update simulation input files to remove differences by adjusting simulation behavior. Comparer 410 may provide comparison results 470 to architecture, compiler, O/S information 415 (e.g., to update such information) and/or to target platform-specific simulation IR files 465 (e.g., to update environment settings and/or IR files that adjust numerical results of simulation).

Architecture, compiler, O/S information 415 may be collected or received by TCE 140, and may include target environment information that may affect internal numerics in simulation and execution on the target processor environment. For example, in one implementation, architecture, compiler, O/S information 415 may include the target processor's architecture (e.g., hardware registers, accumulators, default rounding modes to achieve numeric equivalence in simulation, rounding behavior of arithmetic and/or shift operations, etc.), the target processor's compiler behavior and/or compiler settings (e.g., rounding mode, compiler-specific intrinsics, compiler-specific run-time libraries, conversions of float to fixed data types, optimization level, etc.), the target processor's operating system behavior (e.g., operating system-specific run-time libraries, etc.), etc.

Model 420 may be collected or received by TCE 140 and may include a reference design that may be executed in simulation mode and/or may be automatically translated into target processor code that may be subsequently executed on the target processor. Model 420 may represent a design and/or an algorithm to be implemented on a device (e.g., a target processor). In one implementation, model 420 may include multiple models, with each model representing one or more components of a hardware device (e.g., a target processor). In another implementation, model 420 may include a partitioned model, with each partition representing a component of a multi-component hardware device. Model 420 may include one or more files capable of being accessed by TCE 140, model simulator 400, and/or automatic code generator 405. In one example, model 420 may be provided by a modeling environment (e.g., TCE 140) and/or another similar modeling environment. In another example, TCE 140, model simulator 400, and/or automatic code generator 405 may receive model 420 from an application program interface (API) call to another application or via an interface to another system.

Target processor (TP) code information 425 may be collected by TCE 140 and may include target processor code information that corresponds to target environment attributes and/or may be used to generate environment-aware optimized code. For example, in one implementation, TP code information 425 may include target processor intrinsics, directions for replacing target-neutral code with compiler-specific intrinsics during code generation for improved execution performance in the target environment, etc.

Intermediate simulation results 430 may be generated by model simulator 400, and may include outputs provided by model simulator 400. For example, in one implementation, intermediate simulation results 430 may include outputs from blocks generated by model simulator 400, results within each block, etc. Intermediate simulation results 430 may be compared with intermediate execution results 460 (e.g., by comparer 410) to adaptively fine tune simulation behavior until identical numeric simulation may be achieved.

Source code files 435 may include program instructions of a programming language (e.g., a C programming language), may be provided in a predetermined format and/or style (e.g., following the American National Standards Institute/International Organization for Standardization (ANSI/ISO) C standard), and/or may include fixed-point and/or floating-point source code. The program instructions of source code files 435 may be generated to run on a target operating system (e.g., a real-time operating system), and/or for a target processor. The program instructions of source code files 435 may be optimized for performance, versatility, and/or a target hardware platform. Automatic code generator 405 may be configured, via information 415, model 420, and/or TP code information 425, to generate custom source code files 435 that may include a style and format based on input information. Automatic code generator 405 may be configured, via information 415, model 420, and/or TP code information 425, to provide custom source code files 435 that may support customizations, such as error handling, optimization, code and data reduction, code reusability, scoping of variables, and/or other characteristics of source code files 435 that may be modified during generation of source code files 435.

During generation of source code files 435, automatic code generator 405 may generate source code files 435 for each block of model 420, and may place source code files 435 and data segments of the block's source code into a uniquely named memory section. In an exemplary implementation, automatic code generator 405 may associate source code files 435 and data segments of the block's source code to a named memory section by using a compiler director and/or a linker preprocessing directive of a programming language.

Linker files 440 may be produced by automatic code generator 405 based on information 415, model 420, and/or TP code information 425. For example, automatic code generator 405 may automatically request information 415, model 420, and/or TP code information 425 while automatically generating source code files 435 and/or building program 450. Automatic code generator 405 may build object code 445 into program 450 using linker files 440.

Object code 445 may include a compiled form of source code files 435, and may contain a sequence of instructions that a processor may understand. Automatic code generator 405 may build source code files 435 into object code 445 and/or an executable program (e.g., program 450). For example, automatic code generator 405 may compile source code files 435 and any linker files 440, drivers, and/or other programs via a compiling utility to create object code 445 and/or program 450.

Program 450 may include a compiled and executable form of source code files 435, and may contain a sequence of instructions that a processor may understand. Automatic code generator 405 may build source code files 435 into program 450, as described above. In one implementation, automatic code generator 405 may build multiple programs 450 from one or more models 420 in one or more executions. Automatic code generator 405 may produce multiple sets of source code files 445, multiple linker files 440, and/or multiple sets of object code 445 to produce multiple programs 450. In one example, each program 450 and associated source code files 445, linker files 440, and/or object code 445 may represent algorithms of model 420 to be implemented on separate processors of a computational hardware device which may include communication interfaces between the processors (e.g., a communication interface to a shared memory used by the processors). Each communication interface of programs 450 may transfer data between processors, may broadcast data to multiple processors, and/or may synchronize processing across processors.

Execution in target platform environment 455 may correspond to automatic code generator 405 executing source code files 435, linker files 440, object code 445, and/or program 450 in a target environment. For example, in one implementation, execution in target platform environment 455 may correspond to automatic code generator 405 executing program 450 on a target processor.

Intermediate execution results 460 may include results that correspond to block outputs from model 420, and/or results within each block of model 420. As described above, comparer 410 may compare intermediate execution results 460 with intermediate simulation results 430 to adaptively fine tune simulation behavior until identical numeric simulation is achieved.

Target platform-specific simulation IR files 465 may include a registered simulation behavior for target-specific code registered by TP code information 425. As shown in FIG. 4, target platform-specific simulation IR files 465 may be provided to model simulator 400, as described above.

In a first exemplary implementation, TCE 140 may receive target processor information (e.g., information 415 and/or TP code information 425) and/or model information (e.g., model 420). TCE 140 may automatically set model-wide and/or block-level parameters associated with a target processor, and/or may apply the automatically set parameters in a simulation. For example, TCE 140 may automatically set simulation and/or code generation behavior based on user input information (e.g., processor-specific attributes, compiler-specific attributes, and/or a target processor identity (e.g., a processor name)). This may enable native characteristics of a target environment to be exploited for optimal execution in the target environment, and/or may ensure that simulation results match results of the generated code executing in the target environment. Current design environments may permit a user to register processor-specific attributes, compiler-specific attributes, and/or a target processor identity. However, simulation and/or code generation behavior in such environments may be manually specified for each block (or function) that makes up an application design.

In a second implementation, TCE 140 may determine target environment information (e.g., architecture information, compiler information, compiler settings, operating system (OS) information, compiler and/or OS-specific run time library behavior, result differences cause by different ordering of arithmetic operations, behavior of compiler-specific intrinsics, etc.) during simulation of the automatically set parameters. TCE 140 may apply and/or register the additional target environment information in the simulation to produce results that are bit-accurate with results of the generated code executing in the target environment.

In a third implementation, TCE 140 may update simulation behavior based on differences between intermediate simulation results and corresponding intermediate execution results of the generated code executing in the target environment. TCE 140 may determine additional target environment information (e.g., information not accounted for in the first and second implementations) that cause differences during the updated simulation, and/or may register this additional target environment information in the simulation to attain a bit-true model simulation for the target processor. For example, even with the capabilities described above in the first and second implementations, TCE 140 may not guarantee a bit-true correspondence between simulation and target execution because there may be additional, unaccounted for target environment information. In the third implementation, TCE 140 may add new target environment attributes (e.g., to keep up with advances in target environment technologies), and/or may dynamically compare intermediate simulation and execution results. For any discrepancies in the comparison, TCE 140 may identify causes of discrepancies, may update simulation behavior, and/or may register new target environment information so that they may be specified in future iterations.

In an exemplary embodiment of the three implementation described above, it may be assumed that ten (10) target environment (TE) attributes are used to attain bit-true accuracy between simulation and execution. Three (3) of the ten (10) TE attributes may be exposed in individual blocks, and/or TCE 140 (e.g., as per the first implementation) may automatically set the three TE attributes with proper information based on the specified target environment. During simulation of the three TE attributes, TCE 140 (e.g., as per the second implementation) may expose and/or simulate an additional four (4) of the ten (10) TE attributes. For the remaining three (3) unknown and unaccounted for TE attributes, TCE 140 (e.g., as per the third implementation) may dynamically compare intermediate simulation and execution results to identify causes of discrepancies, may update the simulation behavior, and/or may provide a mechanism to register the three (3) TE attributes that produced the discrepancies. As shown by this example, TCE 140 may expose all ten (10) TE attributes, and/or may automatically set the ten (10) TE attributes with proper values based on the specified environment. This may guarantee bit-true correspondence between simulation and execution for a design and/or subsequent designs for this particular target environment.

Although FIG. 4 shows exemplary components of TCE 140, in other implementations, TCE 140 may include fewer, different, or additional components than depicted in FIG. 4. In still other implementations, one or more components of TCE 140 may perform some or all of the tasks described as being performed by one or more other components of TCE 140.

Exemplary Model Simulator

Figure 5:
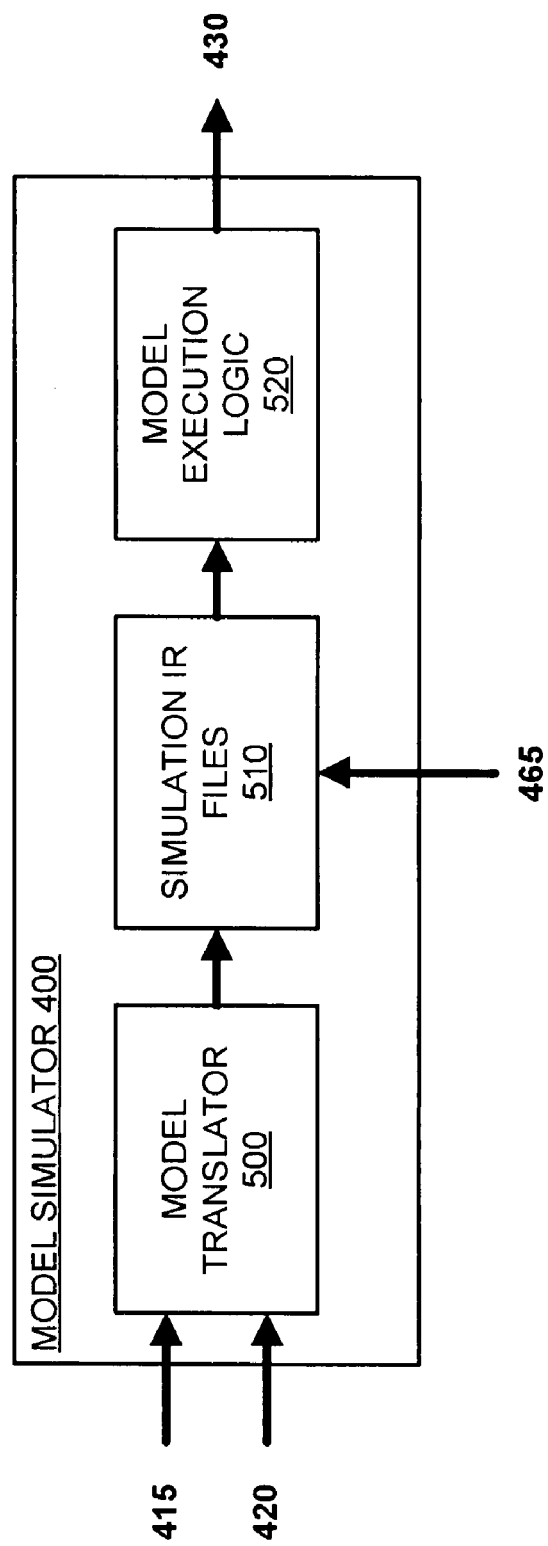
FIG. 5 is an exemplary diagram of a model simulator of the technical computing environment depicted in FIGS. 3 and 4.

FIG. 5 is an exemplary diagram of model simulator 400. As illustrated, model simulator 400 may include a variety of components, such as a model translator 500, simulation intermediate representation (IR) files 510, and/or model execution logic 520.

Model translator 500 may receive architecture, compiler, O/S information 415 and/or model 420, and may translate the received information into a collection of IR files (e.g., simulation IR files 510) that may run in simulation mode. The collection of IR files translated by model translator 500 may represent an execution behavior of a model running on the target environment.

Simulation IR files 510 may receive target platform-specific simulation IR files 465 and output from model translator 500, and may represent an execution behavior of a model running on the target environment. In one implementation, simulation IR files 510 may capture a simulation behavior of model 420. Further details of simulation IR files 510 are provided below in connection with FIGS. 7 and 8.

Model execution logic 520 may receive simulation IR files 510, may execute simulation IR files 510 in simulation mode, and may generate intermediate simulation results 430.

Although FIG. 5 shows exemplary components of model simulator 400, in other implementations, model simulator 400 may include fewer, different, or additional components than depicted in FIG. 5. In still other implementations, one or more components of model simulator 400 may perform some or all of the tasks described as being performed by one or more other components of model simulator 400.

Exemplary Automatic Code Generator

Figure 6:
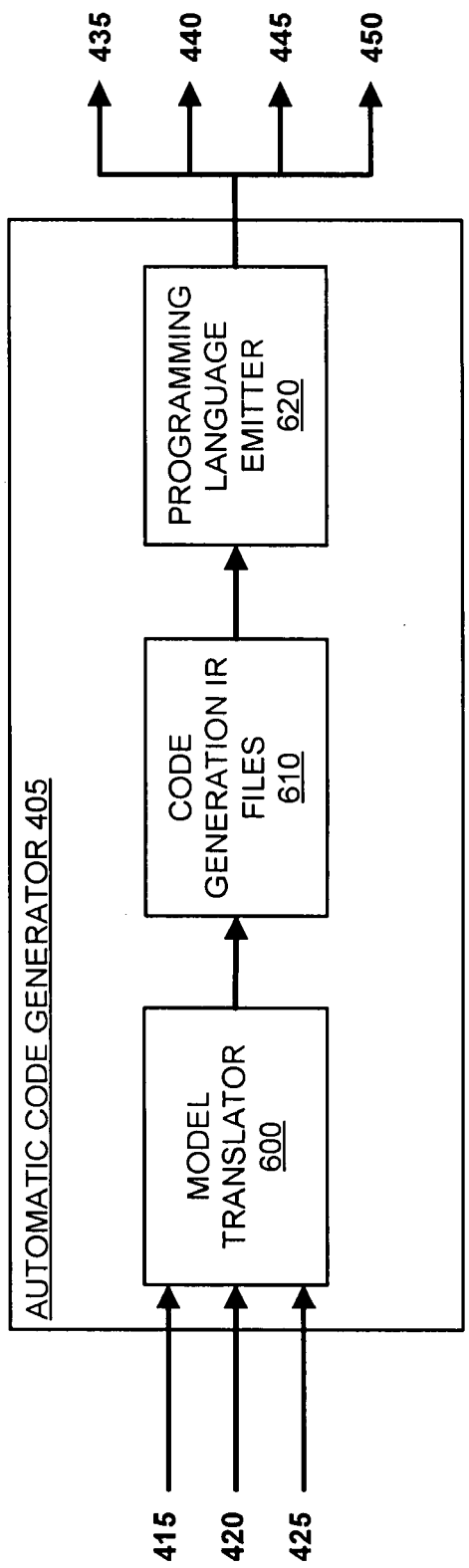
FIG. 6 is an exemplary diagram of an automatic code generator of the technical computing environment depicted in FIGS. 3 and 4.

FIG. 6 is an exemplary diagram of automatic code generator 405. As illustrated, automatic code generator 405 may include a variety of components, such as a model translator 600, code generation intermediate representation (IR) files 610, and/or a programming language emitter 620.

Model translator 600 may receive architecture, compiler, O/S information 415, model 420, and/or TP code information 425, and may generate code generation IR files 610 based on architecture, compiler, O/S information 415, model 420, and/or TP code information 425. For example, model translator 600 may translate architecture, compiler, O/S information 415, model 420, and/or TP code information 425 into code generation IR files 610.

Code generation IR files 610 may receive IR files from model translator 600, and may convey model specifics used to generate code. Code generation IR files 610 may capture an execution behavior of automatically generated code, and may provide model specifics used to generate code to programming language emitter 620. Further details of code generation IR files 610 are provided below in connection with FIGS. 7 and 8.

Programming language emitter 620 may receive model specifics from code generation IR files 610, and may use this information to generate code (e.g., source code files 435, linker files 440, object code 445, and/or program 450) associated with a target processor that may produce results that are bit true to simulation results.

In an exemplary operation, automatic code generator 405 (e.g., model translator 600) may receive architecture, compiler, O/S information 415, model 420, and/or TP code information 425, and may generate source code by translating model 420 into one or more source code files 435. For example, automatic code generator 405 may include the Real-Time Workshop® software and may receive model 420 generated with Simulink® software. Simulink® software may create and/or store model 420 into a model file that includes a ".mdl" file extension. As part of the code generation process, the Real-Time Workshop® software may receive a ".mdl" model file, and may analyze the model file to generate code generation IR files 610. The may include a hierarchical structure of records describing systems and their blocks and connections based on the ".mdl" model file.

A language compiler (e.g., a target language compiler) may be included with the Real-Time Workshop® software, and may work with ".tlc" files and/or ".rtw" files to produce code. The target language compiler may interpret a program that reads the description of the ".rtw" file. If the target language compiler encounters a record in the ".rtw" file, it may use directives in the ".tlc" files corresponding to the record to direct the code generation process for the specific record. For example, the target language compiler may use block ".tlc" files, which may specify the particular code for a block, to transform each block into code. If the target language compiler reads a record in the ".rtw" file that references a block, the target language compiler may apply code from the corresponding block ".tlc" file to generate code for the block in source code files 435. Model wide ".tlc" files may be used to provide input to the target language compiler for global customization of the code. Model wide ".tlc" files may direct the target language compiler to generate main routines that may provide entry points into the program, source code header files that may set up data structures, and/or utility functions that may support code for particular blocks. The block and model wide ".tlc" files may be modified to generate customized code for blocks and to generate any desired global customizations to the code.

Although FIG. 6 shows exemplary components of automatic code generator 405, in other implementations, automatic code generator 405 may include fewer, different, or additional components than depicted in FIG. 6. In still other implementations, one or more components of automatic code generator 405 may perform some or all of the tasks described as being performed by one or more other components of automatic code generator 405.

Exemplary Intermediate Representation Generation

An "intermediate representation (IR)," as the term is used herein, is to be broadly interpreted to include translation of a model (e.g., model 420), a representation (e.g., a data structure that may be stored in memory, a file, a database, and/or any other acceptable storage medium), etc. An IR (e.g., simulation IR files 510 and/or code generation IR files 610) may be constructed from input data contained within a source language (e.g., a language used by a graphical model) and from which part or all of output data contained in a target language (e.g., a generated code) may be constructed. An IR may include a control flow graph (CFG), a data flow graph (DFG), a hybrid, and/or any other representation that preserves properties of information in the source language. An IR may allow for serial and/or parallel processing of the representation in the source language within the IR. The use of an IR may permit translation of a representation in a source language into a representation in a target language such that a system implementation may be generated from an initial system model.

An IR may be generated from a textual and/or graphical model (e.g., a model created with TCE 140) before generating code represented by a programming language (e.g., C, C++, FORTRAN, Java, etc.), a hardware description language (e.g., Verilog, etc.), a scripting language (e.g., Perl, Python, Javascript, etc.), and/or a machine or assembly language. To do this, automatic code generator 405 may parse model 420 into syntactical components and may use the syntactical components to construct an IR such that the IR may represent the semantics of model 420.

Automatic code generator 405 may allow a user to develop an IR for user-specified elements. The IR may be based on computations to be performed, and may not follow model elements (e.g., as they are presented in a graphical model). The IR may permit optimizations to be applied across multiple elements of a graphical model.

Figure 7:
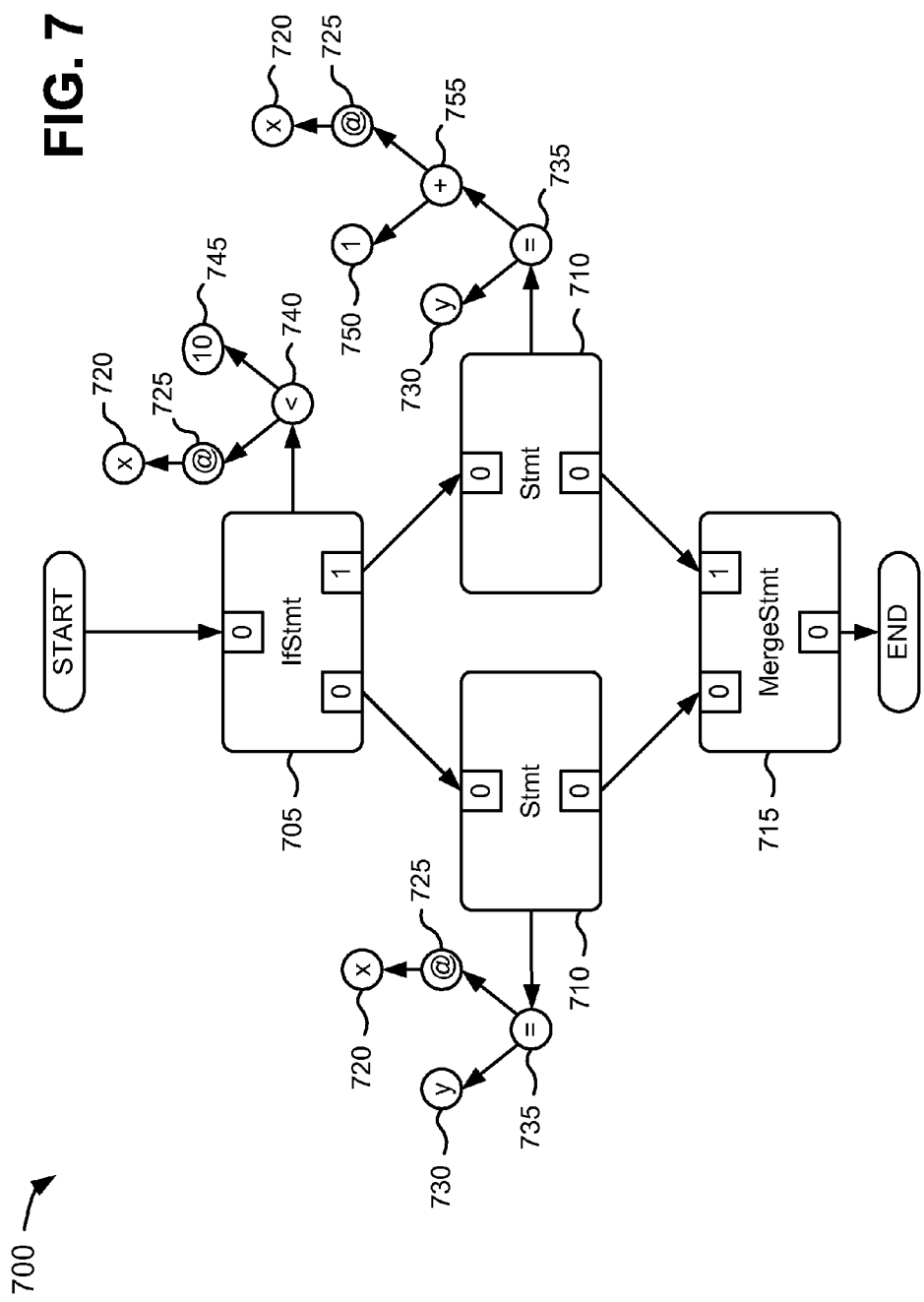
FIG. 7 is an exemplary diagram of an intermediate representation (IR) that may be generated by the model simulator depicted in FIG. 5 and/or by the automatic code generator depicted in FIG. 6.

FIG. 7 is an exemplary diagram of an intermediate representation (IR) 700 that may be generated by model simulator 400 and/or automatic code generator 405. As illustrated, IR 700 may contain CFG parts (e.g., reference numbers 705-715) and DFG parts (e.g., reference numbers 720-755). In this exemplary IR 700, the DFG parts may represent operations performed by assign nodes and/or a compare node of the CFG parts. The C code that may be generated from IR 700 may include the following syntax:

```
int foo(int x)
{
  int y;
  if (x<10) {
    y=1+x;
  } else {
    y=x;
  }
  return y;
}
```

As shown in FIG. 7, IR 700 may begin at a Start node and may continue to an IfStmt node 705, which may evaluate an if-statement. This evaluation may provide a result of an inequality comparison between a value of a variable "x" (720) and a value of "10" (745). To access the value of a variable, a dereference may be performed, as indicated by "@" nodes 725. If an inequality "x<10" (740) holds true, the right-hand branch may be followed, as indicated by a port marked "1." IR 700 may then continue to a Stmt node 710 (right side of FIG. 7). Otherwise, a left-hand branch may be followed, as indicated by a "0" port, and IR 700 may continue to a Stmt node 710 (left side of FIG. 7). In the left-hand branch, a variable "y" (730) may be assigned a value of "x" via an "=" node 735. To access the value of variable "x" (720), a dereference may be performed, as indicated by "@" node 725. In the right-hand branch, variable "y" (730) may be assigned a sum of the value of variable "x" (720) and a value "1" (750), via an "=" node 735. A sum operator 755 may be indicated as a node marked "+" with two arguments (i.e., value "1" (750) and dereference 725 of variable "x" (720)). The two conditional flow paths may be merged, via a MergeStmt node 715, and the flow path of IR 700 may end.

Automatic code generator 405 may perform the following exemplary operations on code generation IR files 610. Automatic code generator 405 may parse model 420, and may generate one or more IRs (e.g., code generation IR files 610) from the parsed model 420. In one example, the IR may be a control flow graph (CFG) that captures semantics of model 420. An IR represented by a CFG may include nodes that represent algorithmic aspects of model 420, and may include edges that indicate a flow for the algorithms. For example, the edges may indicate processing flow of model 420. Subsequently, automatic code generator 405 may generate code (e.g., via program language emitter 620) from the one or more IRs.

Figure 8:
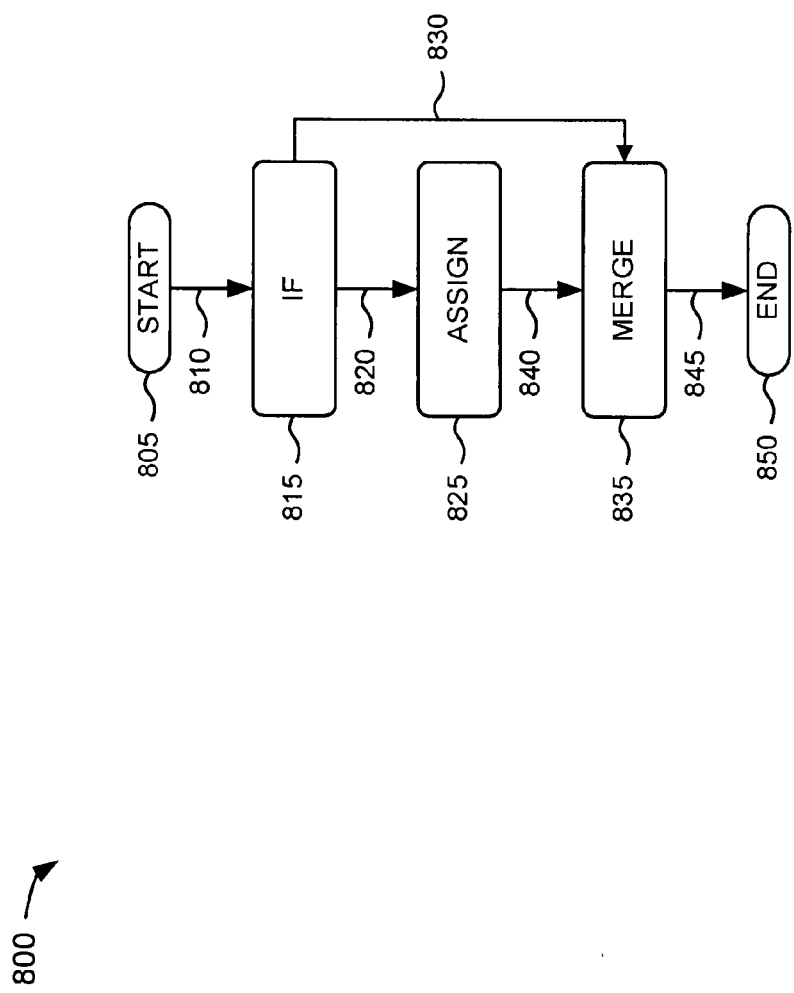
FIG. 8 is an exemplary control flow graph of an intermediate representation that may be generated by the model simulator depicted in FIG. 5 and/or by the automatic code generator depicted in FIG. 6.

FIG. 8 depicts an exemplary control flow graph 800 of an IR that may be generated by construction and general transformation phases of a code generation process. Control flow graph 800 may begin with a start node 805, and may proceed to a conditional node 815 via an edge 810. Conditional node 815 may provide an evaluation of a condition. If the condition is false, control flow graph 800 may proceed to a merge node 835 via an edge 830. If the condition is true, control flow graph 800 may proceed to an assign node 825 via an edge 820. Assign node 825 may assign a value to a variable and may be based on an algebraic equation. Assign node 825 may proceed to merge node 835 via an edge 840. Merge node 835 may perform a merge function and may proceed to an end node 850 via an edge 845.

In one implementation, an IR may be transformed into another IR to arrive at a lower-level representation that may be converted into a desired low level target language. A process of transforming an IR into a lower-level representation may be referred to as "lowering." There may be many stages of lowering processes in the transformation of an IR into a lower-level representation. The same and/or a similar lowering process may be employed more than once. Lowering processes may transform the IR into a state that may be suitable to a backend of a code generation process. If an IR has been transformed into a lower-level representation, a backend utility may be used (e.g., by automatic code generator 405) to generate code in a target language. Such lowering may be performed in a hierarchy. For example, a first portion of a model (e.g., a subsystem) may go through three levels of lowering while a second portion of the model may go through two levels of lowering.

Model simulator 400 and/or automatic code generator 405 may include a transformer that may convert a first IR into a second IR. The first IR may represent algorithmic aspects (e.g., additions, multiplications, logic evaluations at decision points to determine branches of computation, function evaluations, etc.) of an element of a graphical model (e.g., model 420). The transformer may transform the first IR by replacing an integration operation with basic operations that may be directly computed. To this end, the transformer may attempt to match a pattern in the generated IR of an element and/or a portion of a graphical model. The transformer may identify a pattern in the generated IR that matches a pattern (e.g., a pattern depicted in a graphical representation), and may replace the identified pattern in the generated IR with another pattern (e.g., another pattern depicted in a graphical representation).

In one example, the transformer may analyze and transform the first IR into the second IR (which may be simulated). If the first IR is represented by a CFG, the transformer may identify nodes of the CFG that are not supported by a simulator and may replace the non-supported nodes with basic operations that may be supported by the simulator. The transformation may result in the second IR, which may be simulated.

Pattern matching may be implemented in various ways, but may be guided by heuristics to manage computational complexity. Modular and hierarchical graph rewriting methods may further improve the transformation efficiency. The transformer may employ any number of rewriting rules that may be extended by textual transformation information. The rewriting rules may include negativity constraints.

In one implementation, model simulator 400 and/or automatic code generator 405 may apply an optimization technique (e.g., a bit true simulation) to generate a second IR from a first IR. Applying optimization techniques to an IR may improve characteristics of the generated code (e.g., program 450) by, for example, reducing execution time and/or required storage space, and/or may improve efficiency and/or effectiveness of the generated code and/or the code generation process. For example, if a vector is used in a finite state machine model and a target language is the C programming language, then one of the lowering processes may include transforming calculations related to the vector into a for loop.

Optimization techniques may further increase conformance to industrial standards and/or target environment (e.g., TCE 140) requirements (e.g., optimization techniques may increase an ability to generate code that is compatible with such standards/requirements). Applying optimization techniques to IRs may reduce a size of code generated from the IRs. For example, the size of the generated code may determine resource usage if the generated code is compiled into a list (e.g., a netlist) for hardware layout. Applying optimization techniques to IRs may also reduce an overall size of variables used in the generated code.

In one implementation, the application of optimization techniques by model simulator 400 and/or automatic code generator 405 may be iterative. In another implementation, there may be multiple transitions of the IRs before the optimization techniques may be applied, and there may be multiple transitions of the IRs while applying the optimization techniques. At each transition, one or more optimization techniques may be applied by model simulator 400 and/or automatic code generator 405. In other implementations, an optimization technique may be applied multiple times during the code generation process.

In one implementation, model simulator 400 and/or automatic code generator 405 may debug IRs as follows. Model simulator 400 and/or automatic code generator 405 may implement associations between elements in a graphical model and nodes in an IR. For example, a user may set breakpoints on execution of elements in the graphical model, which may cause execution to halt at corresponding operation in the IR. Model simulator 400 and/or automatic code generator 405 may map data in the IR back to the graphical model to enable debugging of the graphical model. For example, an IR may include meta tags to identify derivation of content of the IR. A meta tag may associate the IR content with content that may be used to generate the IR. The content of an IR may be derived from, for example, elements in a graphical model, optimization rules, model configuration options, etc.

Model simulator 400 and/or automatic code generator 405 may provide an optimized IR that combines computations of elements. If a value from one element is to be displayed, model simulator 400 and/or automatic code generator 405 may substitute a more detailed and/or less optimized IR if requested during execution. For profiling purposes, model simulator 400 and/or automatic code generator 405 may maintain an amount of computational time that is spent in parts of the IR. This information may be presented to the user in terms of elements of the model.

In one implementation, model simulator 400 may generate an IR (e.g., simulation IR files 510) for simulation. For example, model simulator 400 may generate the following pseudo code to support a computational simulation.

1. //
2. //Generate intermediate representation for
3. //discrete integration of Y=X+U*Ts
4. //
5. //Retrieve data
6. DataStore* U=get_block_input(block);
7. DataStore* Ts=get_block_sample_time(block);
8. DataStore* X=get_block_state(block);
9. DataStore* Y=get_block_output(block);
10. DataStore* tmpData=create_temp_data_store( );
11. //
12. //Construct simulation operation of tmpData=U*Ts
13. SimOpNode* op1=create_sim_op_multiply(tmpData, U, Ts);
14. //
15. //Construct simulation operation of Y=X+tmpData
16. SimOpNode* op2=create_sim_op_add(Y, X, tmpData);
17. //
18. //Create an object of intermediate representation
19. IRGraph irGraph=create_intermediate_representation_graph( );
20. //
21. //Insert the simulation operations to the intermediate representation
22. irGraph->insert(op1);
23. irGraph->insert(op2);

The pseudo code may generate an IR for a discrete integration block. From line 6 to line 10 of the pseudo code may retrieve data stores for the discrete integration in the form of a data structure "DataStore." The data structure "DataStore" may include information about data (e.g., data type, dimension, complexity, memory storing the data, etc.). Line 13 of the pseudo code may generate a simulation operation node that multiplies an input "U" with a sample time "Ts" and may save results in a temporary data structure "DataStore tmpData." A data structure "SimOpNode" may include information about a simulation operation (e.g., operation type, input and output operation data, rounding and saturation mode, execution rate, simulation operation routines, etc.). Line 16 of the pseudo code may generate a second simulation operation node that adds a state "X" with "tmpData" and may save a result in a data structure "DataStore Y." In line 19 of the pseudo code, a data structure "IRGraph" may be created, may contain information about the IR (e.g., simulation operations, execution order, etc.), and may include a control flow graph. Lines 22 and 23 of the above pseudo code may add two simulation operations to the data structure "irGraph."

Exemplary User Interfaces

Figure 9:
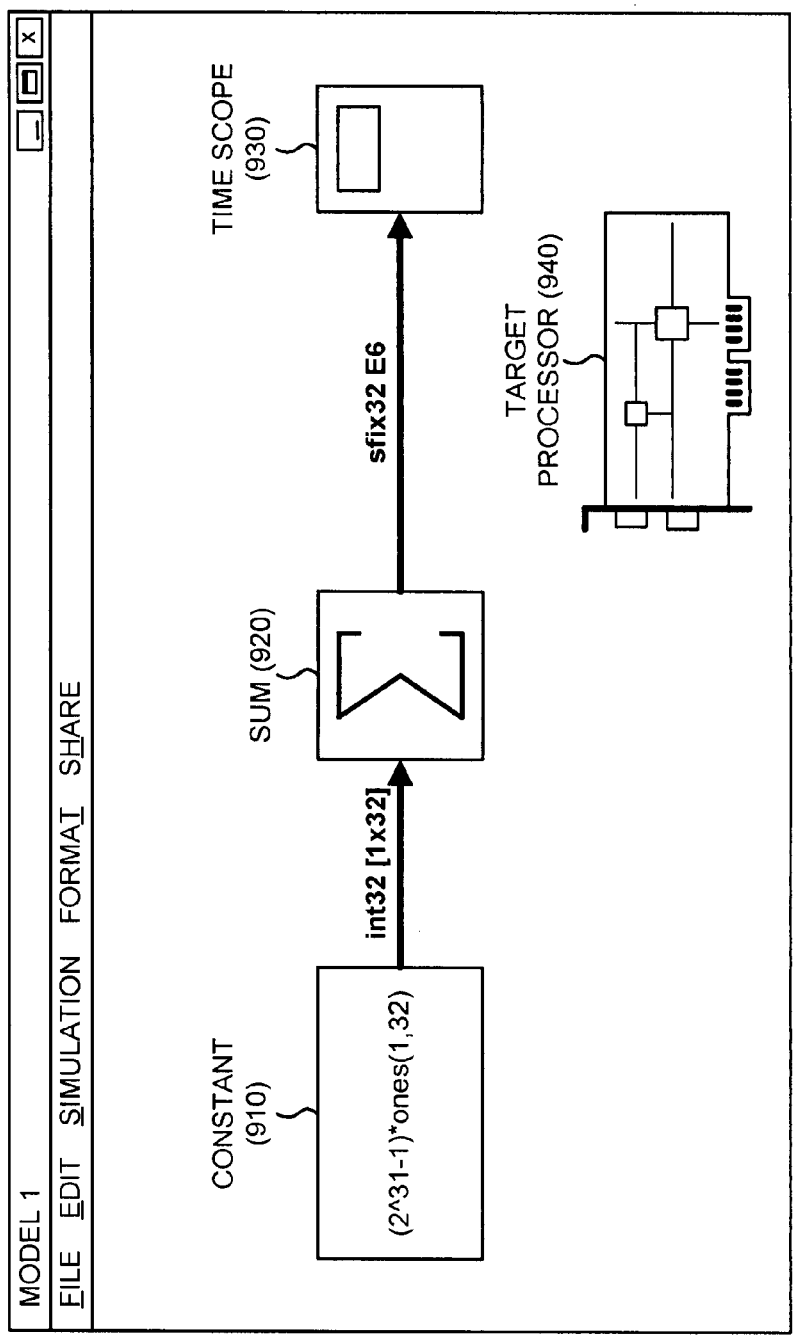
FIG. 9 is an exemplary diagram of a user interface that may be provided by the device of FIGS. 1 and 2.

FIG. 9 is an exemplary diagram of a user interface 900 that may be provided by device 110. User interface 900 may include one or more software and/or hardware components that provide displays to a user of device 110. For example, in one implementation, user interface 900 may display a model (e.g., "MODEL 1") that captures an algorithm that takes an input vector of 32-bit integers and sums them, and outputs a scaled 32-bit result. The generated code may execute on a 32-bit processor. As illustrated, user interface 900 may include a constant block 910, a sum block 920, a time scope block 930, and/or a target processor configuration block 940.

Constant block 910 may generate an input vector of 32-bit integers (e.g., "int32 [1,32]"), and may provide the input vector to sum block 920. Sum block 920 may add the elements of the vector of 32-bit integers together, and may provide a result of the addition in scaled form (e.g., "sfix32 E6") to time scope block 930. Time scope block 930 may receive the result of the addition, and may display a scaled 32-bit result. Target processor configuration block 940 may execute code generated by the model of user interface 900. In one implementation, target processor configuration block 940 may include a 32-bit processor.

Although FIG. 9 shows exemplary components of user interface 900, in other implementations, user interface 900 may include fewer, different, or additional components than depicted in FIG. 9. In still other implementations, one or more components of user interface 900 may perform some or all of the tasks described as being performed by one or more other components of user interface 900.

If no target environment information (e.g., architecture, compiler, O/S information 415, TP code information 425, and/or target platform-specific simulation IR 465) is provided, both the derived simulation code and automatically generated code corresponding to sum block 920 may include the following:

```
int sum_in[32]; /* Sum block input */
int sum_out; /* Sum block output */
int accum; /* accumulator */
int idx;
accum=sum_in[0];
for (idx=1; idx<10; idx++) {
    accum+=sum_in[idx];
}
sum_out=accum>>6;
```

In another implementation, target environment information may be provided as follows. For example, architecture, compiler, O/S information 415 may be provided and may include a rounding mode (e.g., towards zero), an overflow action (e.g., saturate), an accumulator size in number of bits (e.g., forty bits), and/or a long data type size in number of bits (e.g., forty bits). TP code information 425 may be provided and may include a code generation IR section (e.g., convert target processor long data types to target processor "int" data types, and saturate) and/or a target processor's compiler-specific intrinsic (e.g., "int_sat(long src)"). Such TP code information 425 may replace instances of a specified IR section with an intrinsic call in generated code. Target platform-specific simulation IR files 465 may be provided and may include a simulation IR section that corresponds to the code generation IR section from TP code information 425 (e.g., convert target processor long data types to target processor intrinsics and saturate) and/or a replacement IR that may correspond to the following code to be used for simulation of the target processor's compiler-specific intrinsic (e.g., "int_sat(log src)"):

```
if ((src)>2147483647) {
    dest=2147483647; //saturate to MAX_INT
} else if (src)<-2147483648) {
    dest=-2147483648; //saturate to MIN_INT
} else {
    dest=(int)(src);
}
```

TCE 140 (as depicted in FIG. 4) may automatically set parameters based on the target environment information. For example, TCE 140 may set the number of bits of target processor data type "long" to "40" bits and may set other settings (e.g., a target processor type, a byte ordering, etc.). TCE 140 may round integer calculations toward zero, may saturate on integer overflow, may set an output data type mode, may specify an output scaling value, etc.

TCE 140 may derive simulation code (e.g., via model simulator 400) based on the automatically set parameters. For example, TCE 140 may derive the following simulation code based on the target environment information described above:

```
int sum_in[32]; /* Sum block input */
int sum_out; /* Sum block output */
long long accum; /* accumulator */
int idx;
accum=(long long)sum_in[0];
for (idx=1; idx<10; idx++) {
    accum+=sum_in[idx];
}
if ((accum>>6)>2147483647) {
    sum_out=2147483647; //saturate to MAX_INT
} else if ((accum>>6)<-2147483648) {
    sum_out=-2147483648; //saturate to MIN_INT
} else {
    sum_out=(int)(accum>>6);
}
```

TCE 140 may generate code (e.g., via automatic code generator 405) based on the automatically set parameters. For example, TCE 140 may generate the following code based on the target information described above:

```
int sum_in[32]; /* Sum block input */
int sum_out; /* Sum block output */
long accum; /* accumulator */
int idx;
accum=(long)sum_in[0];
for (idx=1; idx<10; idx++) {
    accum+=sum_in[idx];
}
/* Convert 40-bit long to 32-bit int and saturate */
int _sat(long src1):
sum_out=_sat(accum>>6);
```

The code generation IR section of TP code information 425 and the simulation IR section of target platform-specific simulation IR files 465, described above, may ensure bit true simulation of an intrinsic emitted during code generation. However, comparer 410 may compare simulation results with execution of generated code in the target environment, and may discover differences if input vector size is increased. For example, intermediate comparison results (e.g., comparison results 470) may indicate that the values stored in the target processor accumulator in the target environment starts to wrap for large vector sizes, but the simulation fails to mimic this behavior. This may occur because the simulation accumulator may be defined as a 64-bit "long long" data type (e.g., the host computer of the simulation environment may not include a 40-bit data type), whereas the target processor accumulator may be a 40-bit long data type.

If such a situation occurs, TCE 140 may update the simulation IR (e.g. simulation IR files 510) to limit the accumulator usage to the lower forty bits and to zero out the upper twenty-four bits with each accumulation. This may successfully simulate the accumulator wrapping behavior. The comparison results (e.g., comparison results 470) after updating the simulation IR may be bit-true.

TCE 140 may re-generate code after updating the simulation IR. For example, TCE 140 may generate the following simulation code after updating the simulation IR:

```
int sum_in[800]; /* Sum block input */
int sum_out; /* Sum block output */
long long accum; /* accumulator */
int idx;
accum=(long long)sum_in[0];
for (idx=1; idx<10; idx++) {
    accum+=sum_in[idx];
    /* Simulate behavior of target's 40-bit accumulator */
    accum=accum<<24; /* shift out upper 24 bits */
    accum=accum>>24; /* shift right 24 bits with sign
        extension */
}
if ((accum>>6)>2147483647) {
    sum_out=2147483647; //saturate to MAX_INT
} else if ((accum>>6)<-2147483648) {
    sum_out=-2147483648; //saturate to MIN_INT
} else {
    sum_out=(int)(accum>>6);
}
```

Figure 10:
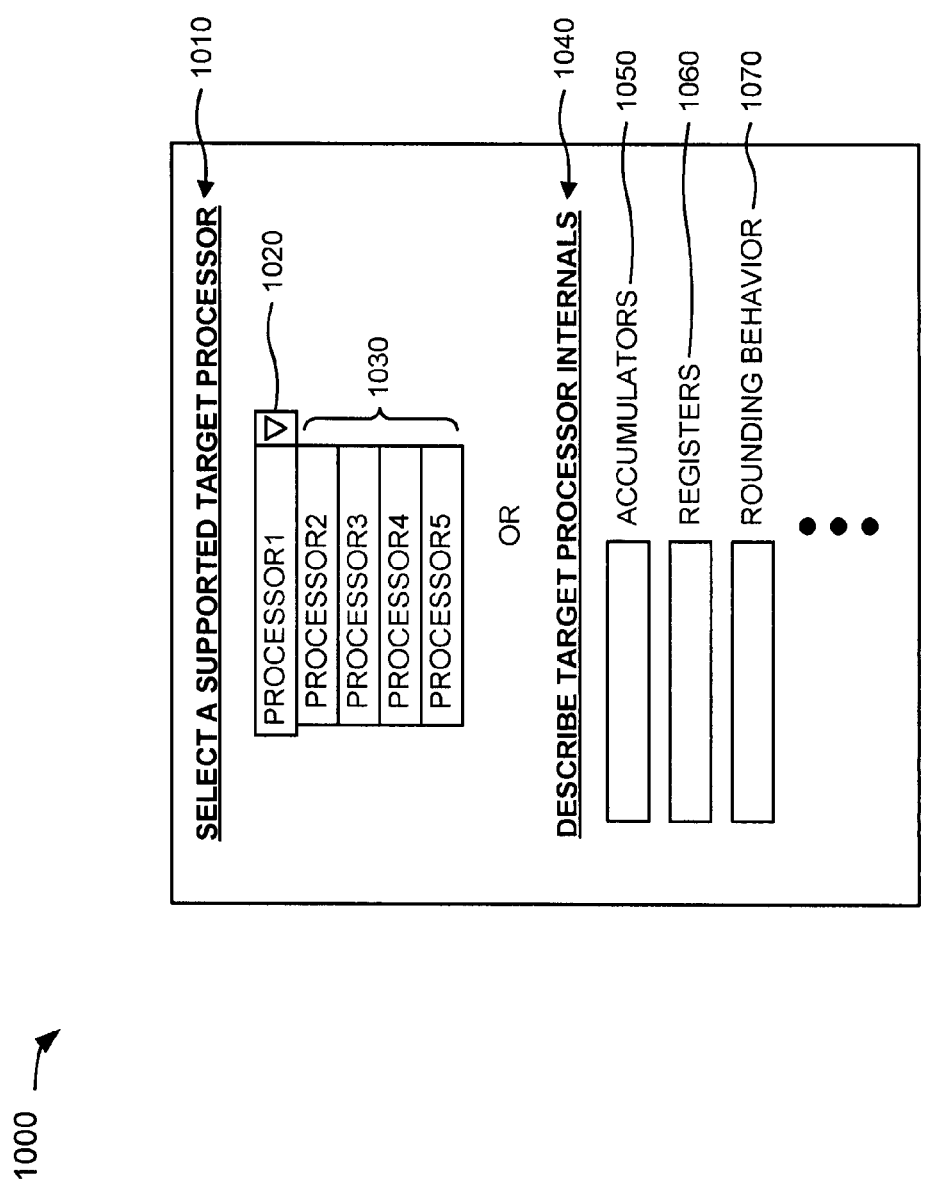
FIG. 10 is an exemplary diagram of another user interface that may be provided by the device of FIGS. 1 and 2.

FIG. 10 is an exemplary diagram of a user interface 1000 that may be provided by device 110. User interface 1000 may include one or more software and/or hardware components that provide displays to a user of device 110. User interface 1000 may provide displays regarding TP internals and/or TP environment to a user of device 110. In one exemplary implementation, user interface 1000 may permit a user of device 110 to select a target processor from a repository of supported target processors (e.g., provided in storage device 250), and/or may permit a user of device 110 to describe TP internals of a custom target processor (e.g., a processor not provided in the repository of supported target processors).

As shown in FIG. 10, user interface 1000 may include a first option 1010 (e.g., "SELECT A SUPPORTED TARGET PROCESSOR") that permits a user to select a target processor from a repository of supported target processors. In one implementation, first option 1010 may provide an input mechanism 1020 that may include, for example, an input field, a drop-down menu providing target processor choices 1030, and/or other similar input mechanisms. A user of device 110 may select a target processor with input mechanism 1020, and the internal attributes associated with the selected target processor may be used as the TP internals by device 110 to provide a bit-true model simulation, as described above.

User interface 1000 may include a second option 1040 (e.g., "DESCRIBE TARGET PROCESSOR INTERNALS") that permits a user to fill out a survey describing the user's custom target processor. In one implementation, second option 1040 may permit a user of device 110 to describe TP internals of the custom target processor (e.g., a processor not provided in the repository of supported target processors). As shown in FIG. 10, second option 1040 may include a variety of fields in which the user may enter information regarding TP internals, such as an accumulators field 1050, a registers field 1060, a rounding behavior field 1070, etc.

Although FIG. 10 shows exemplary components of user interface 1000, in other implementations, user interface 1000 may include fewer, different, or additional components than depicted in FIG. 10. In still other implementations, one or more components of user interface 1000 may perform some or all of the tasks described as being performed by one or more other components of user interface 1000.

Exemplary Processes

FIGS. 11-13D depict flow charts of exemplary processes according to implementations described herein. The processes of FIGS. 11-13D may be performed by one or more software and/or hardware components within device 110. Alternatively, the processes may be performed by one or more software and/or hardware components within another device or a group of devices separate from or including device 110.

As shown in FIG. 11, a process 1100 may begin with receipt or collection of architecture, compiler, compiler settings, and/or operating system (O/S) information (block 1105), and/or receipt or collection of target processor code information (block 1110). For example, in one implementation described above in connection with FIG. 4, architecture, compiler, O/S information 415, model 420, and/or TP code information 425 may be collected or received by TCE 140, and may include target environment information that may affect internal numerics in simulation and execution on the target processor environment. In one example, architecture, compiler, O/S information 415 may include the target processor's architecture, the target processor's compiler behavior and/or compiler settings, the target processor's operating system behavior, etc. In another example, model 420 may represent a design and/or an algorithm to be implemented on a device (e.g., a target processor). In still another example, TP code information 425 may include target processor intrinsics, directions for replacing target-neutral code with compiler-specific intrinsics during code generation for improved execution performance in the target environment, etc.

As further shown in FIG. 11, simulation and/or code generation settings may be established (block 1115), and/or use of target environment-specific semantics may be instructed (block 1120). For example, in one implementation, TCE 140 may establish simulation and/or code generation settings (e.g., via model simulator 400 and/or automatic code generator 405) based on the received architecture, compiler, O/S information 415 and/or model 420. In another implementation, TCE 140 may instruct use of target environment-specific semantics based on the received TP code information 425.

As also shown in FIG. 11, simulation intermediate representation (IR) files may be generated (block 1125), and/or code generation IR files may be generated (block 1130). For example, in one implementation, model simulator 400 of TCE 140 may generate simulation IR files based on the established simulation and/or code generation settings. In another implementation, automatic code generator 405 of TCE 140 may generate code generation IR files based on the established simulation and/or code generation IR files and/or based on the target environment-specific semantics.

As further shown in FIG. 11, target platform-specific simulation IR files may be collected (block 1135), and/or target environment code may be generated (block 1140). For example, in one implementation described above in connection with FIG. 4, model simulator 400 may collect target platform-specific simulation IR files 465. Target platform-specific simulation IR files 465 may include a registered simulation behavior for target-specific code registered by TP code information 425. In another implementation described above in connection with FIG. 4, automatic code generator 405 may receive architecture, compiler, O/S information 415, model 420, and/or TP code information 425, and may generate source code files 435, linker files 440, object code 445, and/or program 450 based on the received information. Automatic code generator 405 may receive model 420 and/or various target environment inputs and other user inputs (e.g., architecture, compiler, O/S information 415, TP code information 425, etc.), and may generate target environment-specific code that can execute efficiently in a target environment.

Returning to FIG. 11, the target platform-specific simulation IR files may be executed in a simulation mode (block 1145), and/or the target environment code may be executed in a target platform environment (block 1150). For example, in one implementation described above in connection with FIG. 4, model simulator 400 may execute target platform-specific simulation IR files 465 in a simulation mode to generate intermediate simulation results 430. In another implementation described above in connection with FIG. 4, execution in target platform environment 455 may correspond to automatic code generator 405 executing source code files 435, linker files 440, object code 445, and/or program 450 in a target environment. In one example, execution in target platform environment 455 may correspond to automatic code generator 405 executing program 450 on a target processor.

Execution of target platform-specific simulation IR files in simulation mode (block 1145) may generate intermediate simulation results, and execution of target environment code in the target platform environment (block 1150) may generate intermediate execution results. For example, in one implementation described above in connection with FIG. 4, model simulator 400 may execute target platform-specific simulation IR files 465 in a simulation mode to generate intermediate simulation results 430. In another implementation described above in connection with FIG. 4, automatic code generator may execute source code files 435, linker files 440, object code 445, and/or program 450 in a target platform environment to generate intermediate execution results 460.

Returning to FIG. 11, the intermediate simulation results and the intermediate execution results may be compared (block 1155), and/or environment settings and/or IR files may be updated (block 1160). The updated environment settings and/or IR files may be used to update the architecture, compiler, compiler settings, and/or O/S information (block 1105) as well as the target platform-specific simulation IR files (block 1135). For example, in one implementation described above in connection with FIG. 4, comparer 410 may receive intermediate simulation results 430 and/or intermediate execution results 460, and may generate comparison results 470 based on the received information. In one example, comparer 410 may compare intermediate simulation results 430 and intermediate execution results 460, may flag any differences between results 430 and 460, and may update simulation input files to remove differences by adjusting simulation behavior. Comparer 410 may provide comparison results 470 to architecture, compiler, O/S information 415 (e.g., to update such information) and/or to target platform-specific simulation IR files 465 (e.g., to update environment settings and/or IR files that adjust numerical results of simulation).

As shown in FIG. 12, a process 1200 may begin with receipt of target processor information and/or model information (block 1210), and/or automatically setting and/or applying model-wide and/or block level parameters in a simulation based on the received information (block 1220). For example, in one implementation described above in connection with FIG. 4, TCE 140 may receive target processor information (e.g., information 415 and/or TP code information 425) and/or model information (e.g., model 420). TCE 140 may automatically set model-wide and/or block-level parameters associated with a target processor, and/or may apply the automatically set parameters in a simulation. For example, TCE 140 may automatically set simulation and/or code generation behavior based on user input information (e.g., processor-specific attributes, compiler-specific attributes, and/or a target processor identity (e.g., a processor name)). This may enable native characteristics of a target environment to be exploited for optimal execution in the target environment, and/or may ensure that simulation results match results of the generated code executing in the target environment.

As further shown in FIG. 12, first target environment (TE) information, determined by the simulation, may be registered (block 1230). For example, in one implementation described above in connection with FIG. 4, TCE 140 may determine target environment information (e.g., architecture information, compiler information, compiler settings, operating system (OS) information, compiler and/or OS-specific run time library behavior, result differences cause by different ordering of arithmetic operations, behavior of compiler-specific intrinsics, etc.) during simulation of the automatically set parameters. TCE 140 may apply and/or register the additional target environment information in the simulation to produce results that are bit-accurate with results of the generated code executing in the target environment.

Returning to FIG. 12, simulation behavior may be updated based on differences between intermediate simulation results and intermediate execution results (block 1240), and/or second target environment (TE) information, determined by the updated simulation, may be registered (block 1250). For example, in one implementation described above in connection with FIG. 4, TCE 140 may update simulation behavior based on differences between intermediate simulation results and corresponding intermediate execution results of the generated code executing in the target environment. TCE 140 may determine additional target environment information that cause differences during the updated simulation, and/or may register this additional target environment information in the simulation to attain a bit-true model simulation for the target processor. In one example, TCE 140 may add new target environment attributes (e.g., to keep up with advances in target environment technologies), and/or may dynamically compare intermediate simulation and execution results. For any discrepancies in the comparison, TCE 140 may identify causes of discrepancies, may update simulation behavior, and/or may register new target environment information so that they may be specified in future iterations.

As further shown in FIG. 12, a bit-true model simulation may be attained for the target processor based on the target processor information, model information, first target environment information, and/or second target environment information (block 1260). For example, in one implementation described above in connection with FIG. 4, TCE 140 may guarantee bit-true correspondence between simulation and execution for a design and/or subsequent designs for a particular target environment.

FIGS. 13A-13D depict an exemplary process 1300 for comparing intermediate simulation results with intermediate execution results, and/or updating target platform-specific simulation IR information 465 and/or architecture, compiler, O/S information 415. In one implementation, process 1300 may be performed by comparer 410 of TCE 140.

Figure 13A:
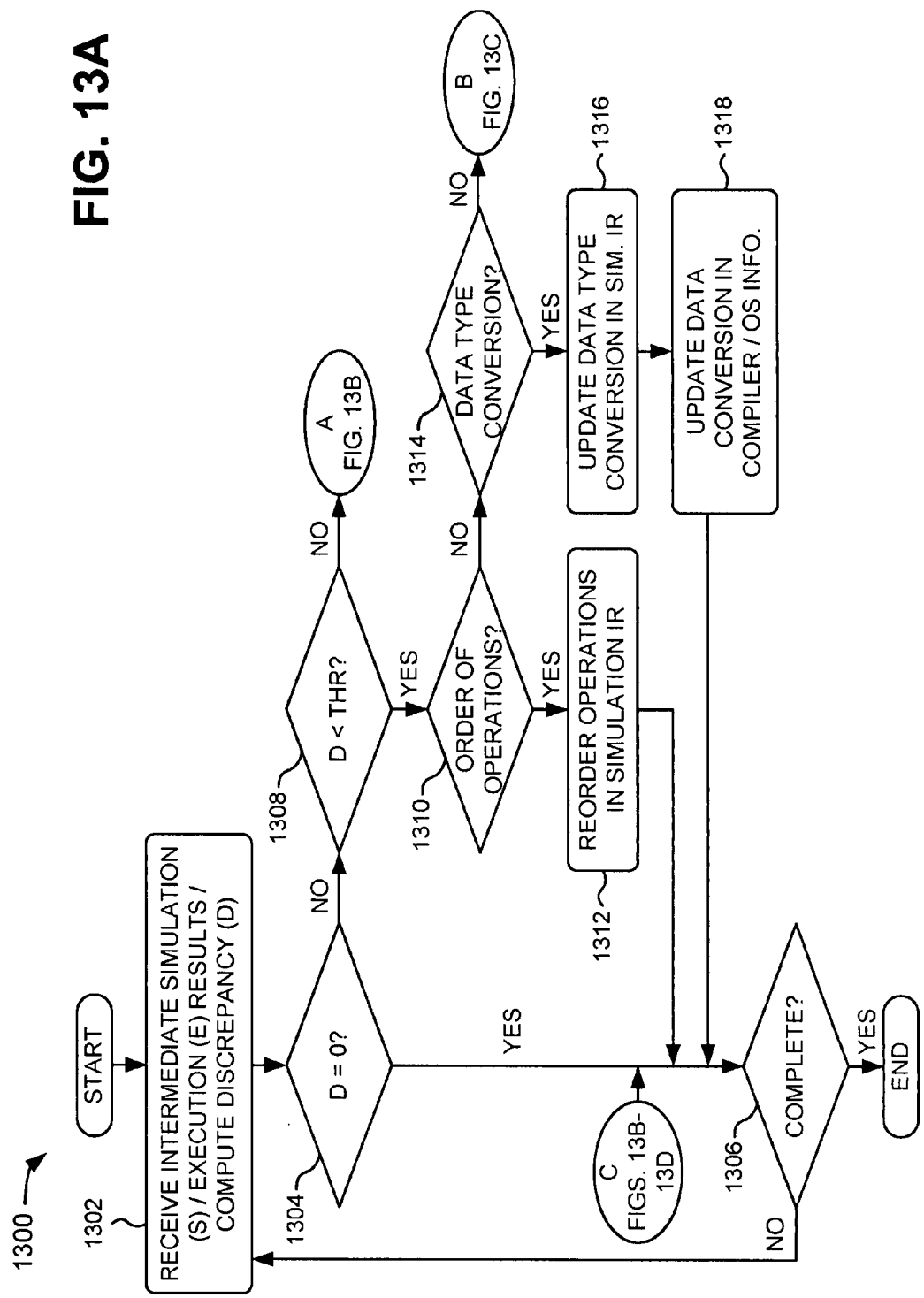

As shown in FIG. 13A, process 1300 may begin with receipt of an intermediate simulation result (S) and an intermediate execution result (E), and/or computation of a discrepancy (D) between the intermediate simulation result (S) and the intermediate execution result (E) (block 1302). For example, in one implementation, comparer 410 may receive one of intermediate simulation results 430 and one of intermediate execution results 460, and/or may compute a discrepancy between the results using an equation (e.g., D=abs(S−E)).

As further shown in FIG. 13A, comparer 410 may determine whether there is a discrepancy by determining whether or not "D=0" (block 1304). If there is no discrepancy (block 1304—YES, i.e., "D=0"), comparer 410 may determine whether process 1300 is complete (block 1306). If process 1300 is complete (block 1306—YES), comparer 410 may cease process 1300. Otherwise (block 1306—NO), comparer 410 may return to block 1302 and may receive another one of intermediate simulation results 430 and another one of intermediate execution results 460.

If there is a discrepancy (block 1304—NO, i.e., "D≠0"), comparer 410 may determine whether the discrepancy is less than a threshold (THR) (block 1308). If the discrepancy is greater than or equal to the threshold (block 1308—NO), comparer 410 may proceed to block "A" of FIG. 13B. If the discrepancy is less than the threshold (block 1308-YES), comparer 410 may determine causes of small discrepancies (e.g., comparer 410 may determine whether the discrepancy is due to an order of operations (block 1310)). If the discrepancy is due to the order of operations (block 1310—YES), comparer 410 may reorder the operations in the simulation intermediate results (IR) (block 1312) and may proceed to block 1306.

If the discrepancy is not due to the order of operations (block 1310—NO), comparer 410 may determine whether the discrepancy is due to a data type conversion (block 1314). If the discrepancy is not due to a data type conversion (block 1314—NO), comparer 410 may proceed to block "B" of FIG. 13C. Otherwise (block 1314—YES), comparer 410 may update the data type conversion (e.g., an algorithm) in the simulation IR (block 1316), may update the data type conversion in compiler, compiler settings, and/or operating system information (e.g., information 415) (block 1318), and/or may proceed to block 1306.

Figure 13B:
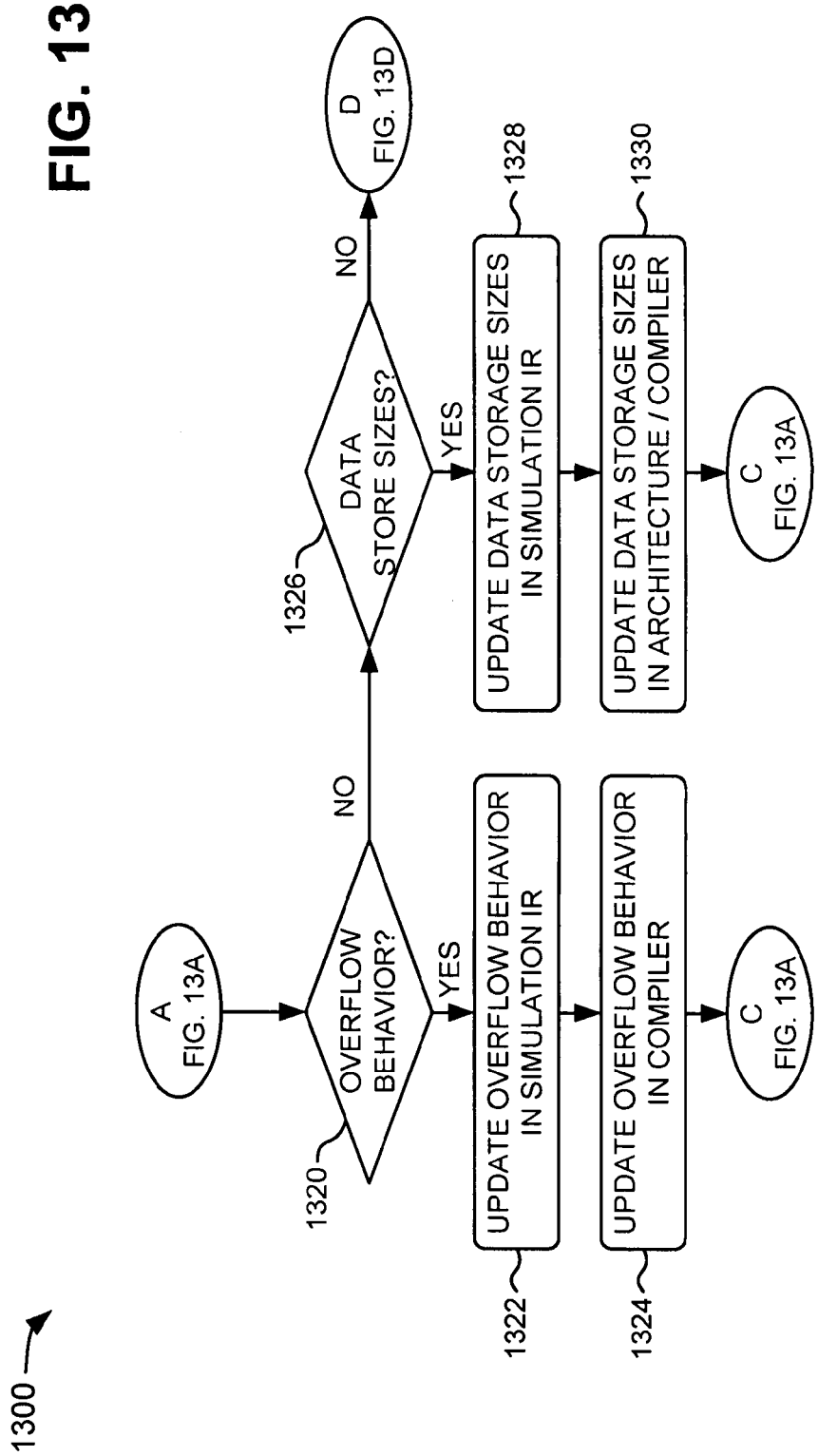

As shown in FIG. 13B, if the discrepancy is due to overflow behavior (block 1320-YES), comparer 410 may update the overflow behavior in the simulation IR (block 1322), may update the overflow behavior in compiler, compiler settings, and/or operating system information (e.g., information 415) (block 1324), and/or may proceed to block "C" of FIG. 13A. If the discrepancy is not due to overflow behavior (block 1320—NO), comparer 410 may determine whether the discrepancy is due to data storage sizes (e.g., accumulator sizes) (block 1326). If the discrepancy is not due to data storage sizes (block 1326—NO), comparer 410 may proceed to block "D" of FIG. 13D. Otherwise (block 1326—YES), comparer 410 may update the data storage sizes in the simulation IR (block 1328), may update the data storage sizes in architecture settings information and/or compiler information (e.g., information 415) (block 1330), and/or may proceed to block "C" of FIG. 13A.

Figure 13C:
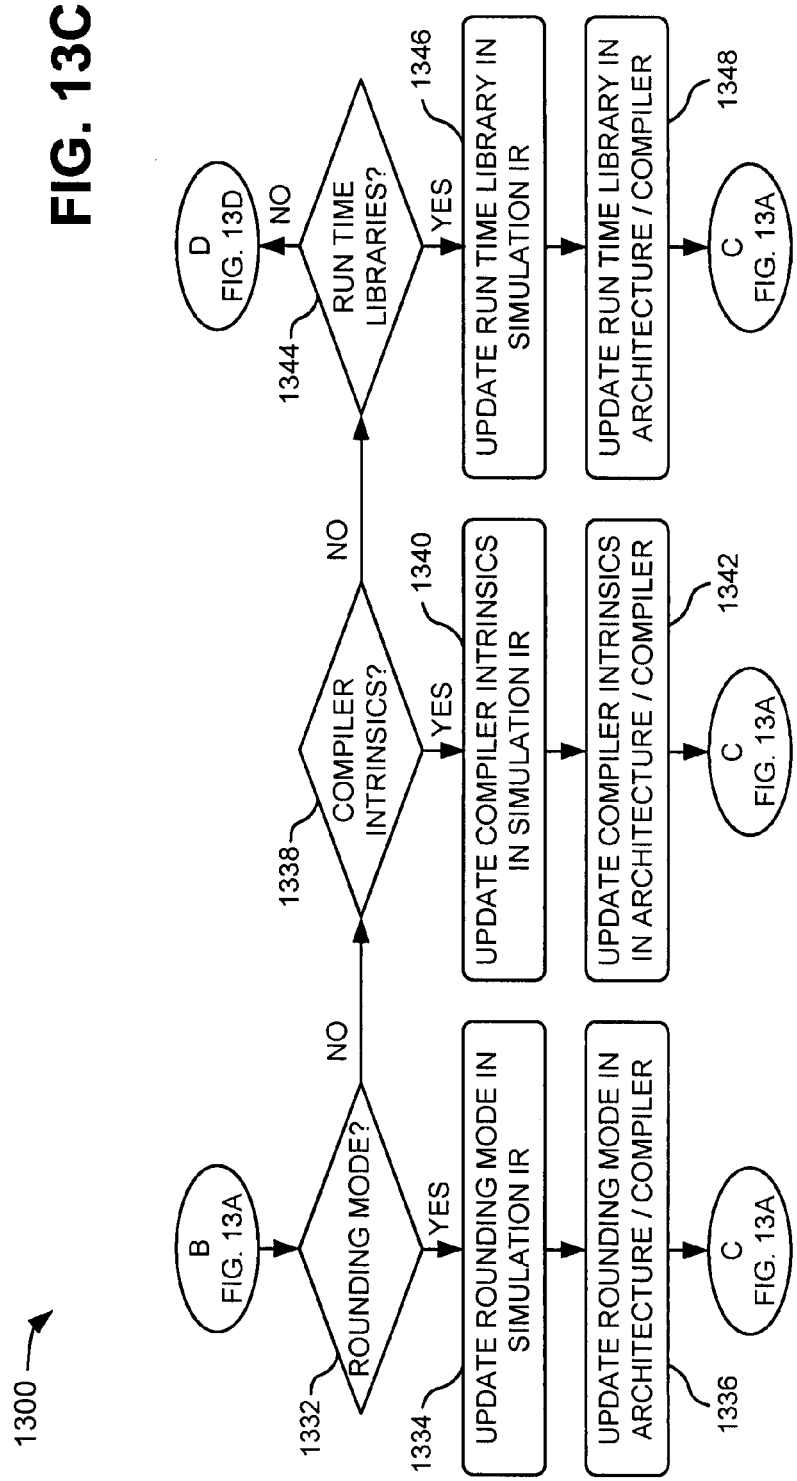

As depicted in FIG. 13C, if the discrepancy is due to rounding mode behavior (block 1332—YES), comparer 410 may update the rounding mode behavior in the simulation IR (block 1334), may update the rounding mode behavior in the architecture settings information and/or compiler, compiler settings, and/or operating system information (e.g., information 415) (block 1336), and/or may proceed to block "C" of FIG. 13A. If the discrepancy is not due to rounding mode behavior (block 1332—NO), comparer 410 may determine if the discrepancy is due to compiler intrinsics (block 1338). If the discrepancy is due to compiler intrinsics (block 1338—YES), comparer 410 may update the compiler intrinsics behavior in the simulation IR (block 1340), may update the compiler intrinsics behavior in the compiler, compiler settings, and/or operating system information (e.g., information 415) (block 1342), and/or may proceed to block "C" of FIG. 13A.

If the discrepancy is not due to compiler intrinsics (block 1338—NO), comparer 410 may determine if the discrepancy is due to run time libraries (block 1344). If the discrepancy is due to run time libraries (block 1344—YES), comparer 410 may update the run time libraries behavior in the simulation IR (block 1346), may update the run time libraries behavior in the compiler, compiler settings, and/or operating system information (e.g., information 415) (block 1348), and/or may proceed to block "C" of FIG. 13A. Otherwise (block 1344—NO), comparer 410 may proceed to block "D" of FIG. 13D.

Figure 13D:
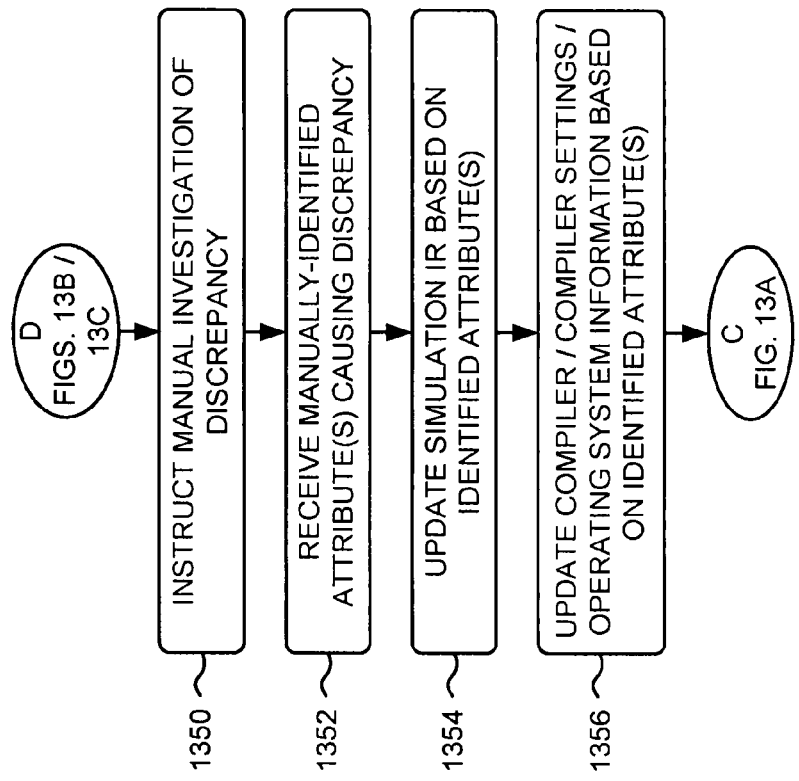

As shown in FIG. 13D, comparer 410 may instruct manual investigation of the discrepancy (block 1350). For example, in one implementation, comparer 410 may instruct a user to investigate the discrepancy to determine the cause (e.g., if comparer 410 is unable to determine the cause). Comparer 410 may receive one or more manually-identified attributes causing the discrepancy (block 1352). For example, in one implementation, the user may investigate the discrepancy, may identify one or more causes, and/or may input the causes to TCE 140 (e.g., for receipt by comparer 410).

As further shown in FIG. 13D, comparer 410 may update the simulation IR based on the one or more manually-identified attributes (block 1354), may update the architecture settings information and/or compiler, compiler settings, and/or operating system information (e.g., information 415) based on the one or more manually-identified attributes (block 1356), and/or may proceed to block "C" of FIG. 13A. For example, in one implementation, the one or more manually-identified causes of the discrepancy may be used by comparer 410 to update intermediate simulation results 430, intermediate execution results 460, and/or information 415.

CONCLUSION

Implementations described herein may provide a mechanism to register and/or specify attributes of a target processor environment that affect numerics, and may constrain simulation behavior of a model such that bit-trueness may be guaranteed for each block output of the model, leading to bit-trueness of an entire model. For example, in one implementation, target processor internal attributes, such as architecture information, compiler information, compiler settings, and/or operating system information, may be collected by a TCE. Simulation and/or code generation settings may be established, and/or simulation intermediate representation (IR) files may be generated. Target platform-specific simulation IR files may be collected by the TCE, and may be executed in a simulation mode to generate intermediate simulation results. A target environment code may be executed in the target platform environment to generate intermediate execution results. The intermediate simulation results and the intermediate execution results may be compared. Environment settings and/or IR files may be updated, and the process may continue until the model simulation matches a code generated implementation executed on the target processor (i.e., until a bit-true model simulation is achieved).

Although exemplary implementations described herein use one or more representations (e.g., languages, pseudo-code, etc.), other implementations and/or examples may be described and/or implemented using other representations.

The foregoing description of implementations provides illustration and description, but is not intended to be exhaustive or to limit the invention to the precise form disclosed. Modifications and variations are possible in light of the above teachings or may be acquired from practice of the invention.

While a series of acts has been described with regard to FIG. 11, the order of the acts may be modified in other implementations. Further, non-dependent acts may be performed in parallel.

It will be apparent that aspects, as described above, may be implemented in many different forms of software, firmware, and hardware in the implementations illustrated in the figures. The actual software code or specialized control hardware used to implement aspects described herein is not limiting of the invention. Thus, the operation and behavior of the aspects were described without reference to the specific software code—it being understood that one would be able to design software and control hardware to implement the aspects based on the description herein.

Further, certain portions of the invention may be implemented as "logic" that performs one or more functions. This logic may include hardware, such as an application specific integrated circuit or a field programmable gate array, software, or a combination of hardware and software.

Even though particular combinations of features are recited in the claims and/or disclosed in the specification, these combinations are not intended to limit the invention. In fact, many of these features may be combined in ways not specifically recited in the claims and/or disclosed in the specification.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A non-transitory computer-readable medium that stores computer-executable instructions, the instructions comprising:
   one or more instructions, executable by at least one processor, to generate intermediate simulation results based on a model and based on internals associated with a target processor, the model including a reference design and the internals include at least one of architecture information, compiler information, compiler settings, or operating system information;
   one or more instructions, executable by the at least one processor, to generate intermediate execution results based on code information associated with the target processor, the target processor internals, and the model;
   one or more instructions, executable by the at least one processor, to compare the intermediate simulation results and the intermediate execution results;
   one or more instructions, executable by the at least one processor, to update the target processor internals based on the comparison; and
   one or more instructions, executable by the at least one processor, to reperform the generate intermediate simulation results, the generate intermediate execution results, the compare, and the update until a bit-true model simulation is achieved for the target processor.

2. The non-transitory computer-readable medium of claim 1, further comprising:
   one or more instructions to receive the target processor internals, the model, and the target processor code information.

3. The non-transitory computer-readable medium of claim 1, further comprising:
   one or more instructions to establish simulation generation settings and code generation settings based on the target processor internals and the model;
   one or more instructions to instruct use of target environment-specific semantics based on the target processor code information, the target processor internals, and the model;
   one or more instructions to generate simulation intermediate representation (IR) files based on the established simulation and code generation settings; and
   one or more instructions to generate code generation IR files based on the target environment-specific semantics.

4. The non-transitory computer-readable medium of claim 3, further comprising:
   one or more instructions to collect target platform-specific simulation intermediate representation (IR) files based on the generated simulation IR files;
   one or more instructions to generate target environment code based on the code generation IR files;
   one or more instructions to generate the intermediate simulation results based on the target platform-specific simulation IR files; and
   one or more instructions to generate the intermediate execution results based on the target environment code.

5. The non-transitory computer-readable medium of claim 1, where the bit-true model simulation occurs when user-specified test vectors associated with the target processor are executed.

6. The non-transitory computer-readable medium of claim 1, where the model is generated by one of a web service or a parallel processing program.

7. The non-transitory computer-readable medium of claim 1, further comprising:
   one or more instructions to update a database using bit-true model simulation information.

8. The non-transitory computer-readable medium of claim 7, further comprising:
   one or more instructions to use the bit-true model simulation information for another target processor.

9. The non-transitory computer-readable medium of claim 7, further comprising:
   one or more instructions to use the bit-true model simulation information for another model.

10. A system, comprising:
    a model simulator that receives a model and internals associated with a target processor, and generates intermediate simulation results based on the model and based on the target processor internals, the model including a reference design and the target processor internals include at least one of architecture information, compiler information, compiler settings, or operating system information;
    an automatic code generator that receives the model, the target processor internals, and code information associated with the target processor, and generates intermediate execution results based on the model, the target processor internals, and the target processor code information; and
    a comparer that compares the intermediate simulation results and the intermediate execution results, and updates the target processor internals based on the comparison, the model simulator regenerating the intermediate simulation results, the automatic code generator regenerating the intermediate execution results, and the comparer comparing the regenerated results until a bit-true model simulation is achieved for the target processor,
    the model simulator, the automatic code generator, and the comparer executing on one or more processors of a computing device.

11. The system of claim 10, where the automatic code generator creates source code files, linker files, object code, and a program, and executes the source code files, linker files, object code, and program in a target platform environment to generate the intermediate execution results.

12. The system of claim 10, where the comparer provides the comparison to the model simulator via target platform-specific simulation intermediate representation (IR) files.

13. The system of claim 10, where the target processor internals further include at least one of information regarding registers, accumulators, default rounding modes to achieve numeric equivalence in simulation, rounding behavior of arithmetic operations, rounding behavior of shift operations of the target processor, compiler behavior, compiler rounding mode, compiler-specific intrinsics, compiler-specific run-time libraries, compiler conversions of float to fixed data types, compiler optimization level, or operating system-specific run-time libraries of the target processor.

14. The system of claim 10, where the reference design is executed in a simulation mode and is automatically translated into target processor code that is subsequently executed on the target processor, and the model further includes at least one of:
    multiple models, with each model representing one or more components of the target processor;
    a partitioned model, with each partition representing one or more components of the target processor; or
    one or more files capable of being accessed by a technical computing environment, the model simulator, and the automatic code generator.

15. The system of claim 10, where the target processor code information includes at least one of information that corresponds to target environment attributes and is used to generate environment-aware optimized code, target processor intrinsics, or directions for replacing target-neutral code with compiler-specific intrinsics during code generation for improved execution performance in a target environment.

16. A system, comprising:
    one or more processors to:
        generate intermediate simulation results based on a model and based on internals associated with a target processor, the model including a reference design and the internals include at least one of architecture information, compiler information, compiler settings, or operating system information;
        generate intermediate execution results based on code information associated with the target processor, the target processor internals, and the model;
        compare the intermediate simulation results and the intermediate execution results;
        update the target processor internals based on the comparison; and
        regenerate the intermediate simulation results and the intermediate execution results, for comparing the regenerated results, and for updating the target processor internals based on the regenerated results comparison until a bit-true model simulation is achieved for the target processor.

17. A non-transitory computer-readable medium that stores computer-executable instructions, the instructions comprising:
    one or more instructions, executable by at least one processor, to receive model information and target processor information associated with a target processor, the model information including a reference design and the target processor information including at least one of architecture information, compiler information, compiler settings, or operating system information;
    one or more instructions, executable by the at least one processor, to automatically apply model-wide and block-level parameters in a simulation based on the model information and based on the target processor information;
    one or more instructions, executable by the at least one processor, to attain a bit-true model simulation for the target processor based on the model information and based on the target processor information;
    one or more instructions, executable by the at least one processor, to determine first target environment information during the simulation;
    one or more instructions, executable by the at least one processor, to apply the first target environment information in the simulation;
    one or more instructions, executable by the at least one processor, to generate first results based on the model information and the target processor information;
    one or more instructions, executable by the at least one processor, to generate second results based on the model information, the target processor information, and code information associated with the target processor;
    one or more instructions, executable by the at least one processor, to update simulation behavior of the simulation based on differences between first results and second results;
    one or more instructions, executable by the at least one processor, to determine second target environment information during the updated simulation; and
    one or more instructions, executable by the at least one processor, to apply the second target environment information in the simulation.

18. The non-transitory computer-readable medium of claim 17, further comprising:
    one or more instructions to attain the bit-true model simulation for the target processor based on the model information, the target processor information, the first target environment information, and the second target environment information.

19. The non-transitory computer-readable medium of claim 17, where the one or more instructions to update simulation behavior comprise:
    one or more instructions to determine a discrepancy between a first result, of the first results, and a second result, of the second results;
    one or more instructions to determine if the discrepancy is greater than or less than a threshold; and
    one or more instructions to determine if the discrepancy is due to one of an order of operations, data type conversion, a rounding mode, compiler intrinsics, or run-time libraries when the discrepancy is less than the threshold.

20. The non-transitory computer-readable medium of claim 19, where the one or more instructions to update simulation behavior further comprise:
    one or more instructions to reorder the operations if the discrepancy is due to the order of operations;
    one or more instructions to update, if the discrepancy is due to the data type conversion, the data type conversion in the first result, the second result, and the target processor information;
    one or more instructions to update, if the discrepancy is due to the rounding mode, the rounding mode in the first result, the second result, and the target processor information;

one or more instructions to update, if the discrepancy is due to the compiler intrinsics, the compiler intrinsics in the first result, the second result, and the target processor information; and one or more instructions to update, if the discrepancy is due to the run time libraries, the run time libraries in the first result, the second result, and the target processor information.

21. The non-transitory computer-readable medium of claim 19, where the one or more instructions to update simulation behavior further comprise:

one or more instructions to determine if the discrepancy is due to one of overflow behavior or data storage sizes when the discrepancy is greater than the threshold;

one or more instructions to update the overflow behavior, if the discrepancy is due to the overflow behavior, in the first result, the second result, and the target processor information;

one or more instructions to update the data storage sizes, if the discrepancy is due to the data storage sizes, in the first result, the second result, and the target processor information;

one or more instructions to instruct manual investigation of the discrepancy;

one or more instructions to receive one or more manually-identified attributes causing the discrepancy; and one or more instructions to update, based on the one or more manually-identified attributes, the first result, the second result, and the target processor information.

22. A method comprising:

generating intermediate simulation results based on a model and based on internals associated with a target processor, the model including a reference design and the internals include at least one of architecture information, compiler information, compiler settings, or operating system information, the generating being performed by one or more processors of a computing device;

generating intermediate execution results based on code information associated with the target processor, the target processor internals, and the model, the generating intermediate execution results being performed by one or more processors of the computing device;

comparing the intermediate simulation results and the intermediate execution results, the comparing being performed by one or more processors of the computing device;

updating the target processor internals based on the comparison, the updating being performed by one or more processors of the computing device; and reperforming the generate intermediate simulation results, the generate intermediate execution results, the compare, and the update until a bit-true model simulation is achieved for the target processor, the reperforming being performed by one or more processors of the computing device.

23. The method of claim 22, further comprising:

establishing simulation generation settings and code generation settings based on the target processor internals and the model;

instructing use of target environment-specific semantics based on the target processor code information, the target processor internals, and the model;

generating simulation intermediate representation (IR) files based on the established simulation and code generation settings; and generating code generation IR files based on the target environment-specific semantics.

* * * * *